(12) United States Patent
Xia et al.

(10) Patent No.: US 9,502,535 B2
(45) Date of Patent: Nov. 22, 2016

(54) SEMICONDUCTOR STRUCTURE AND ETCH TECHNIQUE FOR MONOLITHIC INTEGRATION OF III-N TRANSISTORS

(71) Applicant: Cambridge Electronics, Inc., Cambridge, MA (US)

(72) Inventors: Ling Xia, Belmont, MA (US); Mohamed Azize, Medford, MA (US); Bin Lu, Watertown, MA (US)

(73) Assignee: Cambridge Electronics, Inc., Cambridge, MA (US)

( * ) Notice: Subject to any disclaimer, the term of this patent is extended or adjusted under 35 U.S.C. 154(b) by 0 days.

(21) Appl. No.: 15/094,985

(22) Filed: Apr. 8, 2016

(65) Prior Publication Data
US 2016/0300835 A1 Oct. 13, 2016

Related U.S. Application Data

(60) Provisional application No. 62/146,055, filed on Apr. 10, 2015.

(51) Int. Cl.
*H01L 21/336* (2006.01)
*H01L 27/088* (2006.01)
*H01L 29/66* (2006.01)

(52) U.S. Cl.
CPC ... *H01L 29/66704* (2013.01); *H01L 29/66621* (2013.01); *H01L 29/66734* (2013.01)

(58) Field of Classification Search
CPC .................. H01L 29/66704; H01L 29/66734
USPC ................ 438/217, 289, 586–590, 604, 653; 257/330–332, 393
See application file for complete search history.

(56) References Cited

U.S. PATENT DOCUMENTS 6,849,882 B2  2/2005  Chavarkar et al.
7,183,149 B2  2/2007  Ahn et al.
(Continued)

FOREIGN PATENT DOCUMENTS

WO  WO2014078699 A1  5/2014

OTHER PUBLICATIONS

Chu, Rongming, et al. "V-Gate GaN HEMTs With Engineered Buffer for Normally Off Operation," IEEE Electron Device Letters, Nov. 2008, pp. 1184-1186, vol. 29, No. 11, IEEE, US.
(Continued)

*Primary Examiner* — Calvin Lee
(74) *Attorney, Agent, or Firm* — American Patent Agency PC; Daniar Hussain; Xiaomeng Shi

(57) ABSTRACT

Semiconductor structures are disclosed for monolithically integrating multiple III-N transistors with different threshold voltages on a common substrate. A semiconductor structure includes a cap layer comprising a plurality of selectively etchable sublayers, wherein each sublayer is selectively etchable with respect to the sublayer immediately below, wherein each sublayer comprises a material $Al_xIn_yGa_zN$ ($0 \le x, y, z \le 1$), and wherein at least one selectively etchable sublayer has a non-zero Ga content ($0 < z \le 1$). A gate recess is disposed in a number of adjacent sublayers of the cap layer to achieve a desired threshold voltage for a transistor. Also described are methods for fabricating such semiconductor structures, where gate recesses and/or ohmic recesses are formed by selectively removing adjacent sublayers of the cap layer. The performance of the resulting integrated circuits is improved, while providing design flexibility to reduce production cost and circuit footprint.

18 Claims, 16 Drawing Sheets

(56) References Cited

U.S. PATENT DOCUMENTS

| 7,183,592 | B2* | 2/2007 | Hwang | H01L 27/095 257/195 |
|---|---|---|---|---|
| 7,321,132 | B2 | 1/2008 | Robinson et al. | |
| 7,449,728 | B2 | 11/2008 | Wohlmuth | |
| 7,626,218 | B2 | 12/2009 | Hwang et al. | |

OTHER PUBLICATIONS

Tang, Yong, et al. "High-Performance Monolithically-Integrated E/D mode InAlN/AlN/GaN HEMTs for Mixed-Signal Applications," Electron Devices Meeting (IEDM), 2010 IEEE International, pp. 30-34, IEEE, US.

Chiu, Hsien-Chin, et al. "Enhancement-and Depletion-Mode InGaP/InGaAs PHEMTs on 6-inch GaAs Substrate," Microwave Conference Proceedings, Asia-Pacific Microwave Conference (APMC) 2005, pp. 4-pp, vol. 2. IEEE, US.

Brown D. F., et al. "Monolithic Integration of Enhancement-and Depletion-Mode AlN/GaN/AlGaN DHFETs by Selective MBE Regrowth," IEEE Transactions on Electron Devices, Apr. 2011, pp. 1063-1067, vol. 58, No. 4, IEEE, US.

* cited by examiner

FIG. 13
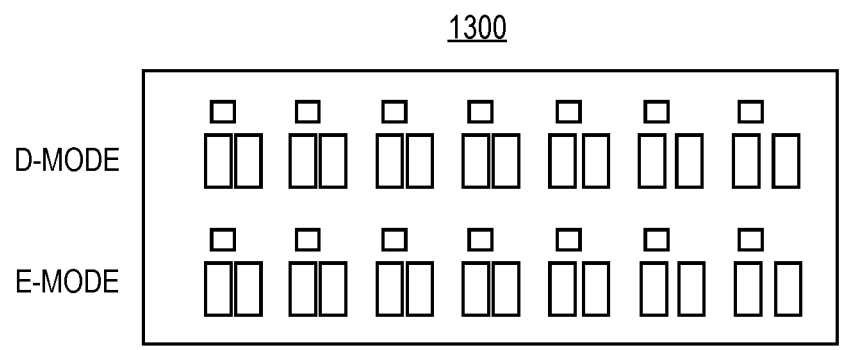
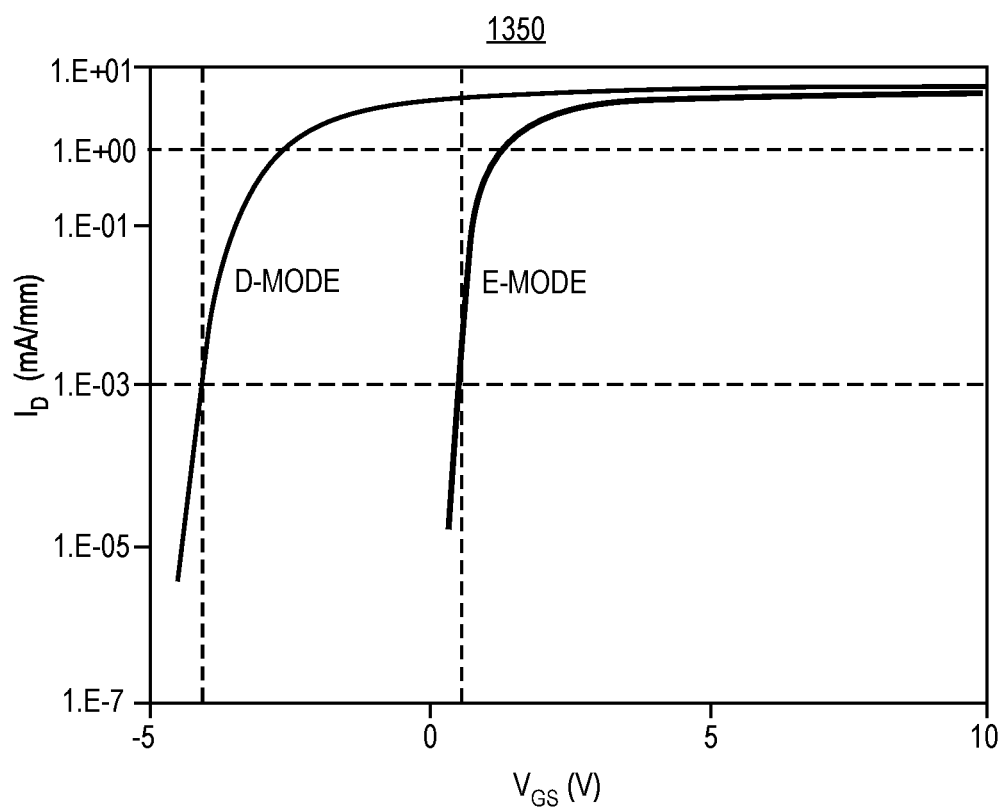

*FIG. 15*
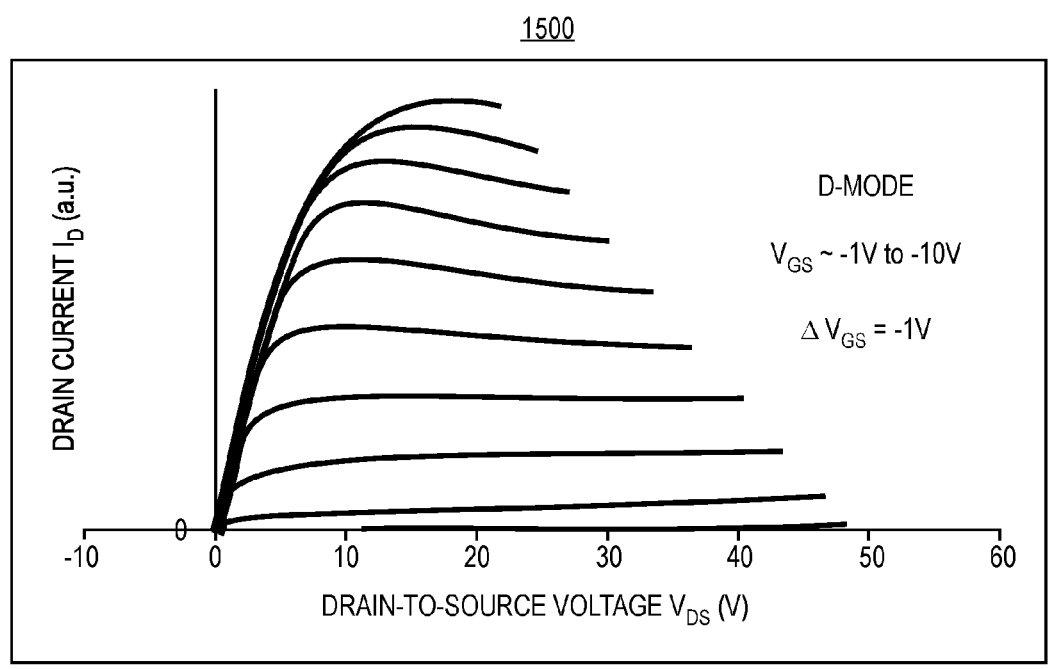
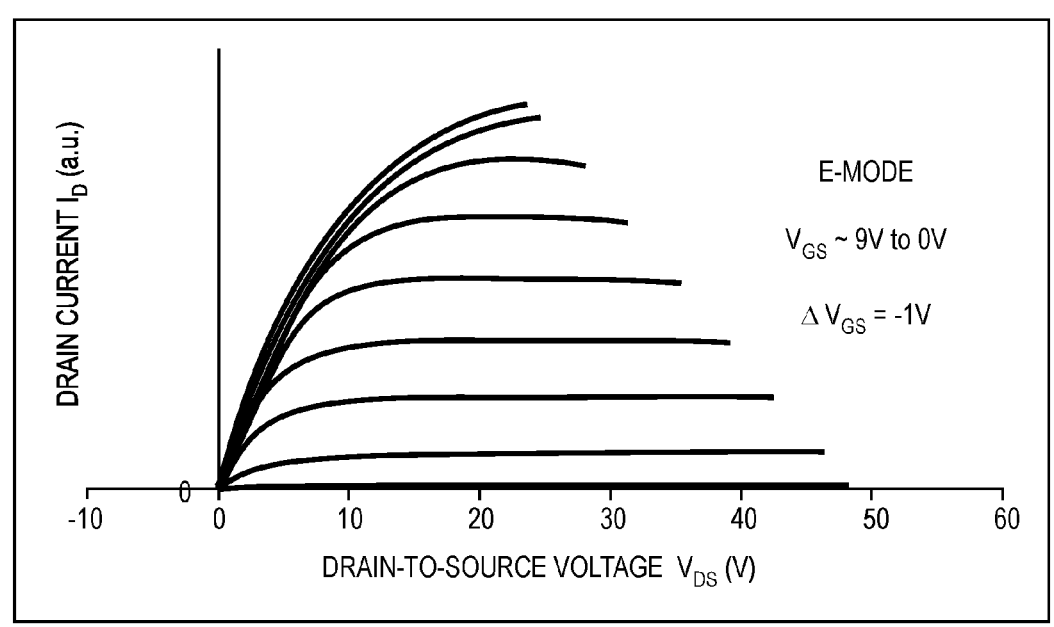

SEMICONDUCTOR STRUCTURE AND ETCH TECHNIQUE FOR MONOLITHIC INTEGRATION OF III-N TRANSISTORS

REFERENCE TO RELATED APPLICATIONS

This application is a non-provisional of and claims the benefit of priority to U.S. Provisional Application Ser. No. 62/146,055, filed on Apr. 10, 2015, entitled "III-Nitride Integration Technology," the disclosure of which is hereby incorporated by reference in its entirety herein.

FIELD OF THE INVENTION

Described herein are semiconductor structures, and processes for forming semiconductor structures. Etching techniques are described for forming recesses in a semiconductor structure, such as gate recesses and/or ohmic recesses, for monolithic integration of III-Nitride transistors on a common substrate. Such structures and techniques can be used to produce high performance transistors for various uses such as in power electronics, power amplification and digital electronics.

BACKGROUND OF THE INVENTION

The statements in this section may serve as a background to help understand the invention and its application and uses, but may not constitute prior art.

Compared with conventional power devices made of silicon, Group III-Nitride (III-N) semiconductors possess a number of excellent electronic properties that enable the fabrication of modern power electronic devices and structures for use in a variety of applications. Silicon's limited critical electric field and relatively high resistance make currently available commercial power devices, circuits, and systems bulky, heavy, with further constraints on operating frequencies. On the other hand, higher critical electric field and higher electron density and mobility of III-N materials allow high-current, high-voltage, high-power and/or high-frequency performances of improved power transistors that are greatly desirable for advanced transportation systems, high-efficiency electricity generation and conversion systems, and energy delivery networks. Such systems rely on efficient converters to step-up or step-down electric voltages, and use power transistors capable of blocking large voltages and/or carrying large currents. For example, power transistors with blocking voltages of more than 500V are used in hybrid vehicles to convert DC power from the batteries to AC power. Some other exemplary applications of power transistors include power supplies, automotive electronics, automated factory equipment, motor controls, traction motor drives, high voltage direct current (HVDC) electronics, lamp ballasts, telecommunication circuits and display drives.

In spite of the enormous potential of III-N semiconductor devices for producing high-efficiency power electronics such as power amplifiers and converters, silicon-based control circuits are still necessary for integrated circuit design for power electronic devices. To enhance the utility of III-N devices, there is a critical need for monolithic integration of III-N transistors with different threshold voltages, especially enhancement-mode (E-mode) and depletion mode (D-mode) transistors. For example, an integrated E/D mode GaN logic circuit may replace a separate, conventional, silicon logic chip. Such monolithic integration of III-N transistors with different threshold voltages may allow the addition of digital or control functions to analog and mix-signal components on a common substrate, thus improving the performance of the resulting integrated circuits, while also providing design flexibility to reduce production cost and circuit foot-print. Accurate and flexible control of threshold voltages for different III-N transistors on a common substrate is also highly desirable. To achieve these implementation and integration objectives, careful technological developments are needed to determine optimal semiconductor material compositions, device structures, and fabrication processes.

For example, an important technology for use in fabricating normally-off E-mode field effect transistors for power switching applications is gate recess. Chlorine-based dry plasma etching is typically used to form gate recesses in AlGaN/GaN devices, as both GaN and AlGaN are very inert to wet chemical etchants. However, dry plasma etching is prone to plasma-induced damage and etch-based process variations. Plasma damage creates a high density of defect states and degrades channel mobility in the recessed region. Variations in the plasma etch rate make it difficult to control recess depth precisely by timed etching, which causes a variation in transistor parameters such as the transconductance and threshold voltage. Etching rates can further vary for different transistor gate lengths and/or aspect ratios. Thus, dry plasma etching-based gate recess techniques are insufficient for the integration of different types of transistors with different target threshold voltages on the same substrate.

Therefore, in view of the aforementioned practicalities and difficulties, there is an unsolved need to monolithically integrate III-N transistors with different threshold voltages on a common substrate. It is against this background that various embodiments of the present invention were developed.

BRIEF SUMMARY OF THE INVENTION

The present invention provides semiconductor structures and methods for fabricating III-nitride transistors with different threshold voltages on a common substrate.

In one aspect, one embodiment of the present invention is a semiconductor structure for integrating III-Nitride (III-N) transistors with different threshold voltages, comprising a common substrate, a buffer layer disposed on the common substrate, a channel layer disposed on the buffer layer, a band-offset layer disposed on the channel layer, and a cap layer comprising a plurality of selectively etchable sublayers. Each of the buffer layer, the channel layer, and the band-offset layer comprises a III-N material. Each sublayer of the cap layer is selectively etchable with respect to the sublayer immediately below, wherein each sublayer comprises a III-N material $Al_xIn_yGa_zN$ ($0 \leq x, y, z \leq 1$), and wherein at least one of the plurality of selectively etchable sublayers has a non-zero Ga content ($0 < z \leq 1$). The semiconductor structure further comprises transistor structures including a first transistor with a first threshold voltage $V_{T1}$, comprising a first gate region and a first pair of ohmic contacts disposed outside the first gate region, wherein the first gate region comprises a first gate recess disposed in a first number of adjacent sublayers of the cap layer, and a second transistor with a second threshold voltage $V_{T2}$, comprising a second gate region and a second pair of ohmic contacts disposed outside the second gate region.

In some embodiments of the present invention, the gate region of the first transistor further comprises a gate dielectric disposed over the first gate recess. In some embodiments, the gate region of the second transistor also comprises a second gate recess disposed in a second number of adjacent sublayers of the cap layer, wherein the second number of sublayers is different from the first number of sublayers. In some embodiments, the second gate region further comprises a second gate dielectric disposed over the second gate recess.

In some embodiments of the present invention, the semiconductor structure further comprises a first pair of ohmic recesses, wherein the first pair of ohmic contacts are disposed over and cover the first pair of ohmic recesses, and wherein the bottoms of the first pair of ohmic recesses are on a layer selected from the group consisting the channel layer, the band-offset layer, and a sublayer of the cap layer. In some embodiments, the semiconductor structure further comprises a second pair of ohmic recesses, wherein the second pair of ohmic contacts are disposed over and cover the second pair of ohmic recesses, and wherein the bottoms of the second pair of ohmic recesses are on a layer selected from the group consisting the channel layer, the band-offset layer, and a sublayer of the cap layer.

In some embodiments of the present invention, the semiconductor structure further comprises a spacer layer disposed on the band-offset layer, wherein the space layer comprises a III-N material, and wherein the thickness of the spacer layer is less than or equal to 20 nm.

In some embodiments of the present invention, the first transistor is enhancement-mode, with the first threshold voltage $V_{T1}>0$, the second transistor is depletion-mode, with the second threshold voltage $V_{T2}<0$. In some embodiments, at least one of the plurality of selectively etchable sublayers has an Al content greater than 50% ($0.5<x\le1$). In some embodiments, adjacent sublayers of the cap layer have Al contents alternating between less than 50% ($0\le x<0.5$) and greater than 50% ($0.5<x\le1$). In some embodiments, materials for adjacent sublayers of the cap layer alternate between GaN and AlN. In yet other embodiments, the III-N materials for the layers and/or sublayers are selected from the group consisting of GaN, AlN, AlGaN, InAlN, and AlInGaN. In some embodiments, a subset of the plurality of the sublayers of the cap layer is doped. The spacer layer may be doped or partially doped as well.

In another aspect, one embodiment of the present invention is a method for integrating III-N transistors with different threshold voltages, comprising the steps of patterning a III-N semiconductor structure to expose a gate region of a first transistor with a first threshold voltage $V_{T1}$, selectively recessing the gate region of the first transistor by removing a first number of adjacent sublayers of the cap layer, patterning the III-N semiconductor structure to expose a gate region of a second transistor with a second threshold voltage $V_{T2}$, forming gate electrodes for both the first and the second transistors, and forming ohmic contacts for both the first and the second transistors. The III-N semiconductor structure comprises a common substrate, a buffer layer disposed on the substrate, a channel layer disposed on the buffer layer, a band-offset layer disposed on the channel layer, and a cap layer comprising a plurality of selectively etchable sublayers. Each of the buffer layer, the channel layer, and the band-offset layer comprises a III-N material. Each sublayer of the cap layer is selectively etchable with respect to the sublayer immediately below, wherein each sublayer comprises a III-N material $Al_xIn_yGa_zN$ ($0\le x, y, z\le1$), wherein at least one of the plurality of selectively etchable sublayers has a non-zero Ga content ($0<z\le1$).

In some embodiments of the present invention, the method further comprises disposing gate dielectrics over the gate region of the first transistor and the gate region of the second transistor. In some embodiments, the method further comprises selectively recessing the gate region of the second transistor by removing a second number of adjacent sublayers of the cap layer, wherein the second number of sublayers is different from the first number of sublayers. In some embodiments, the method further comprises forming a first pair of ohmic recesses, wherein the first pair of ohmic contacts are disposed over and cover the first pair of ohmic recesses, and wherein the bottoms of the first pair of ohmic recesses are on a layer selected from the group consisting the channel layer, the band-offset layer, and a sublayer of the cap layer. In some embodiments, the first transistor is enhancement-mode, with the first threshold voltage $V_{T1}>0$, and wherein the second transistor is depletion-mode, with the second threshold voltage $V_{T2}<0$. In some embodiments, adjacent sublayers of the cap layer have Al contents alternating between less than 50% ($0\le x<0.5$) and greater than 50% ($0.5<x\le1$).

Yet other aspects of the present invention include the semiconductor structures, processes and methods comprising the steps described herein, and also include the processes and modes of operation of the devices described herein. Other aspects and embodiments of the present invention will become apparent from the detailed description of the invention when read in conjunction with the attached drawings.

The foregoing summary is provided by way of illustration and is not intended to be limiting.

BRIEF DESCRIPTION OF DRAWINGS

Embodiments of the present invention described herein are exemplary, and not restrictive. Embodiments will now be described, by way of examples, with reference to the accompanying drawings. In these drawings, each identical or nearly identical component that is illustrated in various figures is represented by a like reference character. For purposes of clarity, not every component is labeled in every drawing. The drawings are not necessarily drawn to scale, with emphasis instead being placed on illustrating various aspects of the techniques and devices described herein.

FIG. 13 shows an illustrative fabricated device with both D-mode and E-mode transistors, and corresponding $I_D$-$V_{GS}$ characteristics, according to one embodiment of the present invention.

FIG. 15 shows plots of $I_D$-$V_{DS}$ characteristics for integrated D-mode and E-mode transistors, according to one embodiment of the present invention.

DETAILED DESCRIPTION OF THE INVENTION

Figure 1A:
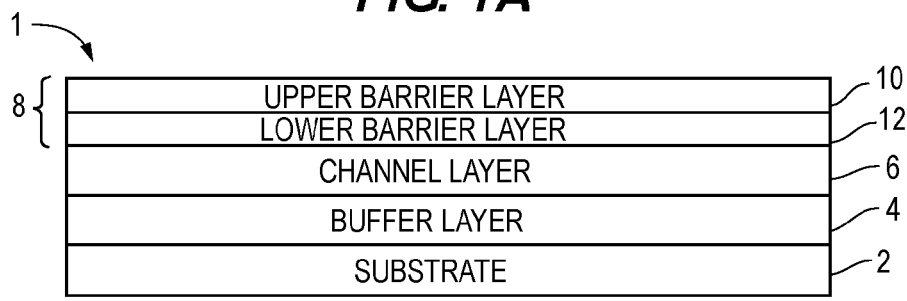
FIGS. 1A, 1B, 1C, and 1D show a semiconductor structure with a dual layer barrier structure and an etching process for forming a recess in the semiconductor structure, according to one embodiment of the present invention.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or flow diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, embodiments of the present invention relate to multi-layer semiconductor structures and methods for fabricating such structures, with one or more gate recesses to facilitate the monolithic integration of Group III-Nitride (III-N) transistors having different threshold voltages. The threshold voltage of a transistor is a gate voltage past which the transistor is turned from an on-state to an off-state, or vice versa. Such multi-layer semiconductor structures utilize selectively etchable layers or sublayers disposed over a common substrate, where selective etchability enables gate recesses and/or ohmic recesses to be formed with controllable depths, leading to desired or targeted threshold voltages. Monolithic integration of different types of transistors, especially E-mode and D-mode transistors, may greatly enhance the utility of such devices, by allowing the further addition of digital or control functions to analog and mix-signal components on a common substrate, thus improving the performance of the resulting integrated circuits, while also providing design flexibility to reduce production cost and circuit foot-print.

Gate recess is an important technology for certain types of transistors, including nitride semiconductor-based transistors such as AlGaN/GaN high-electron-mobility transistors (HEMTs). In radio frequency AlGaN/GaN HEMTs, gate recess has been used to reduce short channel effects and to improve the current gain cut-off frequency. In power switching applications, gate recess has been used to fabricate normally-off field effect transistors, such as AlGaN/GaN HEMTs. Since both GaN and AlGaN are very inert to wet chemical etchants, chlorine-based dry plasma etching is typically used to form gate recesses in AlGaN/GaN devices. There are, however, two major drawbacks to dry plasma etching: 1) it may cause plasma damage, creating a high density of defect states and degrading the channel mobility in the recessed region; and 2) due to variations in the plasma etch rate, it may be difficult to control the recess depth precisely by timed etching, which causes a variation in transistor parameters such as the transconductance ($g_m$) and threshold voltage ($V_T$). Control of device variations becomes even more challenging when devices with different gate lengths are subjected to the same gate recess etching process, as the etching rates can be different for different transistor gate lengths and/or aspect ratios.

Described herein are semiconductor structures and processes for forming such semiconductor structures while reducing or eliminating plasma-induced damage and etch-based process variations. A recess etching fabrication technology is described which can precisely control the etching depth and produce an extremely low defect density on the recessed surface. In some embodiments, the semiconductor structures described herein may be formed of compound semiconductor material(s), such as III-V semiconductor material(s), particularly Group III-Nitride (III-N) semiconductor material(s). Using such techniques, high performance transistors can be fabricated, such as RF III-N and/or normally-off III-N power transistors, for example.

Further described herein are multi-layer semiconductor structures that enable the integration of multiple transistors with different threshold voltages on a common substrate, and processes for forming such semiconductor structures. While providing precise control over individual etching depths and producing extremely low defect densities on recessed surfaces, the multi-layer semiconductor structure and recess etching fabrication technology as described herein further enable flexible, side-by-side integration of multiple transistor devices with different gate recess depths and/or ohmic recess depths, leading to different threshold voltages.

The techniques described herein can exploit etching selectivity between different semiconductor materials such as different III-N semiconductor materials. For example, GaN can be selectively etched over materials such as AlN, AlGaN, InAlN and AlInGaN with high Al content using a dry etching technique. In some embodiments, a selective dry etching step followed by a wet etching step can be used to achieve precise control of recess depth and to produce a surface with a low density of defect states. The wet etching step, if performed, may be selective or non-selective. If the wet etching step is selective, AlN AlGaN, InAlN and AlInGaN with high Al content can be selectively etched over materials such as GaN, AlGaN, InGaN, and AlInGaN with low Al content using a wet etching technique. However, the techniques described herein are not limited as to a wet etching step.

With reference to the figures, embodiments of the present invention are now described in detail.

FIG. 1A shows a semiconductor structure 1 on which an etching technique as described herein may be performed. Semiconductor structure 1 may include a substrate 2, a buffer layer 4, a channel layer 6, and a barrier layer 8. Barrier layer 8 includes an upper barrier layer 10 and a lower barrier layer 12. In some embodiments, upper barrier layer 10 is formed of a material that is etchable by a first etching technique, such as dry etching, and lower barrier layer 12 is formed of a material that is etchable by a second etching technique, such as wet etching. In this embodiment, lower barrier layer 12 is substantially not etched by the first etching technique used to etch upper barrier layer 10, thus forming an etch-stop. Examples of materials that may form the semiconductor structure 1 will now be described.

In some embodiments, a semiconductor material with a lattice constant different from that of substrate 2 may be formed over substrate 2. In some embodiments, a buffer layer 4 may be included between substrate 2 and the overlying semiconductor material to accommodate a difference in lattice constant. Substrate 2 may include a group IV, III-V, or II-VI semiconductor material such as silicon, germanium, or ZnO for example. Other typical substrates include SiC, Sapphire, Si, and bulk GaN. The semiconductor material formed over substrate 2 may include a compound semiconductor material, such as a III-V semiconductor material (e.g., a III-N material). Suitable techniques for accommodating a lattice mismatch between substrate 2 and a semiconductor material of different lattice constant using a buffer layer 4 are understood by those of ordinary skill in the art, and will not be detailed herein. In some embodiments, a substrate 2 having a suitable lattice constant for the formation of overlying compound semiconductor material(s) may be used, and buffer layer 4 may be omitted. For example, substrate 2 may be a GaN substrate, a ZnO substrate or another substrate of a material with a lattice constant similar to that of a compound semiconductor material to be formed thereon. The techniques described herein are not limited as to substrate 2 or buffer layer 4. In addition, although not shown explicitly in FIG. 1A, in some embodiments, a nucleation layer is disposed between substrate 2 and buffer layer 4; in some other embodiments, buffer layer 4 includes the nucleation layer or a nucleation region at the interface with substrate 2.

Substrate 2 and the layers of semiconductor materials formed thereon may be monocrystalline, and may have any suitable crystallographic orientation. Compound semiconductor materials, if included in substrate 2 or an overlying layer, may have any suitable composition at the face of the semiconductor material. If a III-N material is included, it may have an N-face composition or a group III face composition. For example, GaN may be grown either N-face and Ga-face or in non-polar orientations.

Channel layer 6 may be formed of a semiconductor material suitable for formation of a channel therein. In some embodiments, channel layer 6 may include a III-V semiconductor material, such as a III-N semiconductor material. In some embodiments, channel layer 6 may include gallium nitride (GaN). In some embodiments, a nitride semiconductor material may be used such as $B_wAl_xIn_yGa_zN$, for example, in which w, x, y and z each has a suitable value between zero and one (inclusive), and w+x+y+z=1.

In some embodiments, a semiconductor heterostructure may be formed in the semiconductor structure 1. For example, in some embodiments a barrier layer 8 comprising $B_{w1}Al_{x1}In_{y1}Ga_{z1}N$ and a channel layer 6 comprising $B_{w2}Al_{x2}In_{y2}Ga_{z2}N$ may be formed, where a semiconductor material of barrier layer 8 has a larger bandgap and/or polarization than that of channel layer 6. However, the techniques described herein are not limited as to the formation of heterostructures.

As implicitly implied above, in some embodiments, each layer formed over substrate 2, including buffer layer 4, channel layer 6, and barrier layer 8 may comprise more than one materials, including III-N materials. For example, buffer layer 4 may comprise an AlN/GaN superlattice. In some embodiments, a portion or one or more regions of buffer layer 4 or channel 6 may be GaN. Such regions may be located at layer interfaces, or at positions particularly defined with respect to desired gate or ohmic contact regions. For example, the nucleation layer as described before may be included as part of buffer layer 4 at the interface with substrate 2. In yet some other embodiments, one or more layers formed over substrate 2 may be doped with a suitable dopant.

As discussed above, in some embodiments, a barrier layer 8 may be formed having two or more layers or sublayers. For example, barrier layer 8 may include a "dual-layer" barrier structure having an upper barrier layer 10 of a first semiconductor material that is etchable using a first etching technique and a lower barrier layer 12 of a second semiconductor material that is etchable using a second etching technique. In some embodiments, upper barrier layer 10 may include a semiconductor material that is selectively etchable in a dry etching process, such as GaN, for example, or another nitride semiconductor material such as $B_wAl_xIn_yGa_zN$, for example, in which w, x, y and z each has a suitable value between zero and one (inclusive), and w+x+y+z=1, and the composition is such that the nitride semiconductor material is selectively etchable using a dry etching process. For example, upper barrier layer 10 may include a semiconductor material such as $B_wAl_xIn_yGa_zN$ in which x is less than 0.25.

Upper barrier layer 10 may be doped or undoped. Doping of upper barrier layer 10 may supply carriers to channel layer 6 underneath. After gate recessing, one or more doped regions may be formed between the gate and the source and/or between the gate and the drain, outside of the gate-recess. A doped region may be polarization doped or may include dopants such as n-type dopants or p-type dopants. A doped region may have any suitable doping concentration and distribution. For example, dopants may be provided at the lower surface of upper barrier layer 10, the upper surface of upper barrier layer 10, and/or in another location. The doping profile can be uniform or non-uniform. In some embodiments, a delta-doping profile may be used. If upper barrier layer 10 is doped, any suitable doping technique may be used, such as implantation or diffusion. In some embodiments, upper barrier layer 10 may be doped during its formation (e.g., growth). In some embodiments, the doping type of upper barrier layer 10 may be of the same type as that of carriers in the channel region. For example, the doping type in upper barrier layer 10 may be n-type for an n-channel transistor and p-type for a p-channel transistor. In some embodiments, the doped region may be highly doped.

Lower barrier layer 12 may include a semiconductor material that is etchable using a wet etching technique, such as aluminum nitride (AlN), for example, or another material such as $B_wAl_xIn_yGa_zN$, for example, in which w, x, y and z each has a suitable value between zero and one (inclusive), and w+x+y+z=1, and the composition is such that the nitride semiconductor material is etchable using a wet etching process. For example, lower barrier layer 12 may include a semiconductor material such as $B_wAl_xIn_yGa_zN$ in which x is greater than 0.5. Furthermore, lower barrier layer 12 may be doped using any suitable doping technique such as those discussed above with respect to the optional doping of upper barrier layer 10.

The reference herein to $B_wAl_xIn_yGa_zN$ or a "$B_wAl_xIn_yGa_zN$ material" refers to a semiconductor material having nitride and one or more of boron, aluminum, indium and gallium. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant such as silicon and germanium.

A process of forming a transistor in the semiconductor structure 1 of FIG. 1A using two separate etching steps will be described with respect to FIGS. 1B-1D.

Figure 1B:
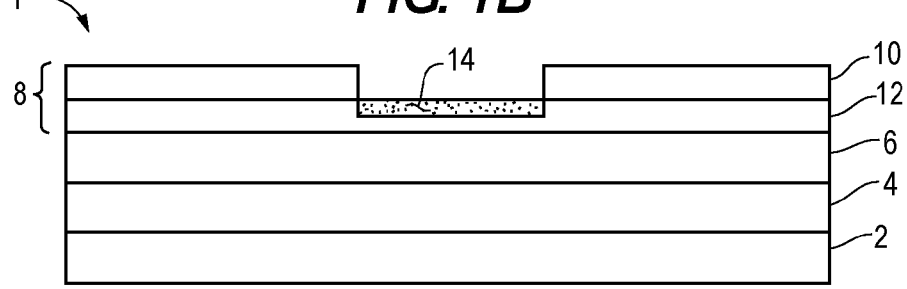

As shown in FIG. 1B, a first etching step may be performed using a first etching technique to remove a portion of upper barrier layer 10. A suitable masking process may be used to define the region to be etched. The etching technique used in the first etching step may selectively etch the material of upper barrier layer 10 with respect to the material of lower barrier layer 12. The selectivity of the etch process used in the first etching step may be greater than one, such that upper barrier layer 10 is etched at a faster rate than lower barrier layer 12. In some embodiments, the selectivity of the etch process used in the first etching step may be greater than 3:1, such that upper barrier layer 10 is etched at a rate greater than three times as high as the rate at which lower barrier layer 12 is etched.

As discussed above, the first etching technique may include a dry etching technique (e.g., dry plasma etching, also referred-to as reactive ion etching (RIE)). If the upper barrier layer includes GaN, a fluorine-based etching process may be used, for example. FIG. 1B shows semiconductor structure 1 following the removal of a region of upper barrier layer 10 using a dry etching process. Lower barrier layer 12 may serve as an etch stop to stop the dry etching process at its upper surface. The dry etching process may damage the upper surface of lower barrier layer 12, creating a damaged region 14. However, in some embodiments, the dry etching process may not produce any significant damage. In some embodiments, a damaged region 14 of barrier layer 12 may be oxidized prior to removal of damaged region 14 in a second etching step.

Figure 1C:
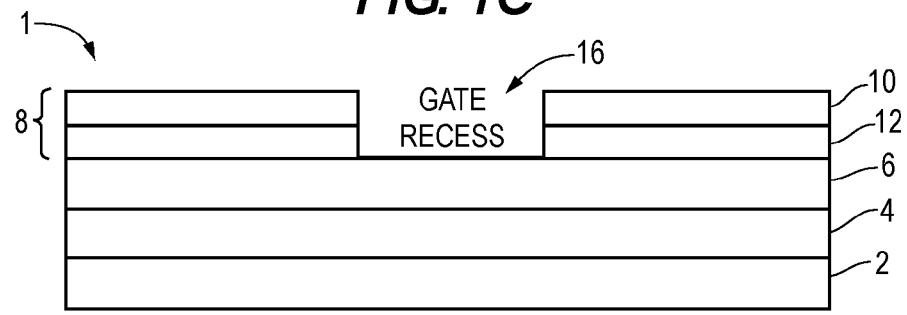

As shown in FIG. 1C, a second etching step may be performed using a second etching technique to remove a portion of lower barrier layer 12. However, the second etching step is optional, and is not required be performed.

If the second etching step is performed, a portion of lower barrier 12 may be removed in a window formed by the removal of a region of upper barrier layer 10 in the first etching step. In some embodiments, the etch process used in the second etching step may selectively etch lower barrier layer 12 with respect to a layer overlying lower barrier layer 12 and which may be in contact with lower barrier layer 12, such as upper barrier layer 10, for example. In some embodiments, the etch process used in the second etching step may selectively etch lower barrier layer 12 with respect to a layer below lower barrier layer 12 which may be in contact with lower barrier layer 12, such as channel layer 6 and/or a band offset layer. The selectivity of the etching of lower barrier layer 12 with respect to upper barrier layer 10 and/or channel layer 6 may be greater than one, such that the rate of etching of lower barrier layer 12 is greater than that of upper barrier layer 10 and/or channel layer 6. In some embodiments, the selectivity may be greater than 3:1, such that lower barrier layer 12 is etched at a rate greater than three times as high as upper barrier layer 10 and/or channel layer 6. However, the second etching step is not required to be selective, and in some embodiments may not selectively etch lower barrier layer 12 with respect to upper barrier layer 10 or channel layer 6.

As discussed above, the etching technique used in the second etching step may be a wet etching technique. FIG. 1C shows the semiconductor structure 1 following the removal of a region of lower barrier layer 12 using a wet etching process. The wet etching process may remove damaged region 14, and may enable forming a gate recess 16 without a damaged region at its lower surface. The wet etching process may remove the entire thickness of lower barrier layer 12, as shown in FIG. 1C, or a portion of the thickness of lower barrier layer 12. In some embodiments, the use of a wet etching process to etch lower barrier layer 12 may provide fine control over the depth of gate recess 16 and reduce or eliminate process-induced variations in transistor characteristics such as threshold voltages.

Figure 1D:
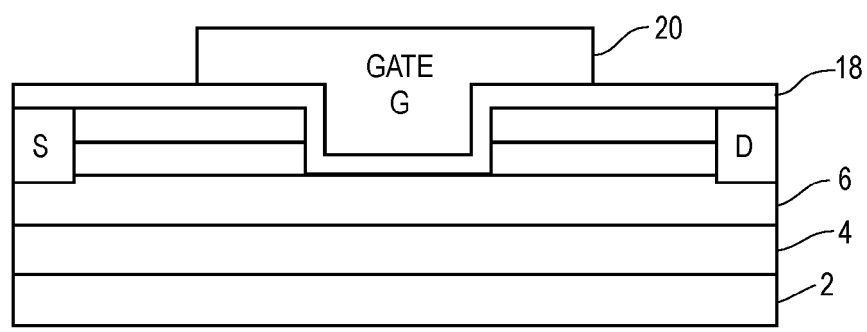

As shown in FIG. 1D, a gate dielectric 18 and a gate 20 may be formed in gate recess 16. Any suitable material may be used for gate dielectric 18 and gate 20. Gate dielectric 18 may be formed of any suitable insulator. Gate 20 may be formed of any suitable conductor or semiconductor, such as a metal or polysilicon. Source and drain regions S and D can also be formed, as understood by those of ordinary skill in the art. The source and/or drain regions S and D may be formed of a suitable conductor or semiconductor, such as a metal and/or a doped semiconductor region. The source and/or drain regions S and D may have ohmic contacts.

In some embodiments, upper barrier layer 10 may be selectively etched over lower barrier layer 12 in the source and/or drain region(s). Lower barrier layer 12 may be wet etched in the source and/or drain regions(s) so that an ohmic metallization can be formed on the remaining barrier layer in the source and/or drain regions(s). The dry and/or wet etching of upper barrier layer 10 and/or lower barrier layer 12, respectively, to form the source and/or drain region(s) may be performed in the same etching process(es) used to form the gate recess, in some embodiments, or in a different process.

In some embodiments, the portion of barrier layer 8 remaining after the formation of gate recess 16 may have a thickness smaller than a critical thickness to prevent the formation of a two dimensional electron gas (2DEG) under the gate (see FIG. 5, for example), thereby forming a normally-off transistor. However, as shall be discussed with respect to FIGS. 7-10, the techniques described herein are not limited to the formation of normally-off transistors, and may be used to form other devices, such as normally-on transistors.

The operation of normally-on and normally-off transistors is summarized as follows. When a normally-off, or Enhancement mode (E-mode) transistor has no voltage applied to the gate, the transistor is in the off-state and is substantially non-conducting. When a suitable voltage is applied to the gate, a normally-off transistor is in the on-state and carriers can flow between its main conduction terminals (e.g., source and drain). The threshold voltage of a transistor is a gate voltage past which the transistor is turned from an on-state to an off-state, or vice versa. The threshold voltage $V_T$ of a normally-off (E-mode) transistor is generally positive. When a normally-on, or Depletion mode (D-mode) transistor has no voltage applied to the gate, the transistor is in the on-state and carriers can flow between its main conduction terminals (e.g., source and drain). When a normally-on transistor has a suitable voltage applied to the gate, the normally-on transistor is in the off-state and is substantially non-conducting. The threshold voltage $V_T$ of a normally-on (D-mode) transistor is generally negative.

In some embodiments, carriers may be supplied to channel layer 6 by a layer different from upper barrier layer 10 or lower barrier layer 12. FIGS. 2A-2D illustrate an embodiment in which a dedicated carrier donor layer 22 is included in the semiconductor structure. In the embodiment shown in FIGS. 2A-2D, carrier donor layer 22 is formed over upper barrier layer 10. However, the techniques described herein are not limited in this respect, as carrier donor layer 22 may be formed below upper barrier layer 10 or in another location. In some embodiments, carrier donor layer 22 may be formed of the same material as that of upper barrier layer 10.

Carrier donor layer 22 may supply carriers to channel layer 6. After gate recessing, which removes a portion of carrier donor layer 22 as well, the remaining portion of carrier donor layer 22 may supply carriers to channel layer 6 approximately outside of the region under the gate. Carrier donor layer 22, if included in the semiconductor stack, may be doped using any suitable doping technique such as those discussed above with respect to the optional doping of upper barrier layer 10. After gate recessing, one or more doped regions may be formed in carrier donor layer 22 between the gate and the source and/or between the gate and the drain, outside of the gate-recess. A doped region may be polarization doped or may include dopants such as n-type dopants or p-type dopants. A doped region may have any suitable doping concentration and distribution. For example, dopants may be provided at the lower surface of carrier donor layer 22, the upper surface of carrier donor layer 22, and/or in another location. The doping profile can be uniform or non-uniform. In some embodiments, a delta-doping profile may be used. Any suitable doping technique may be used, such as implantation or diffusion, for example. In some embodiments, carrier donor layer 22 may be doped during its formation or growth. In some embodiments, the doping type of carrier donor layer 22 may be of the same type as that of carriers in the channel region. For example, the doping type in carrier donor layer 22 may be n-type for an n-channel transistor and p-type for a p-channel transistor. In some embodiments, a doped region may be highly doped. If a carrier donor layer 22 is included, in some embodiments, upper barrier layer 10 and/or lower barrier layer 12 may not be doped.

In some embodiments, carrier donor layer 22 may be formed of a semiconductor material that is etchable by a dry etching process. Carrier donor layer 22 may include a compound semiconductor such as a III-V semiconductor material, e.g., a III-N semiconductor material, such as $B_w Al_x In_y Ga_z N$, for example, in which w, x, y and z each has a suitable value between zero and one (inclusive), and w+x+y+z=1, and the composition is such that the III-N semiconductor material is etchable using a dry etching process. As shown in FIGS. 2A-2D, a barrier layer 28 may include a carrier donor layer 22, an upper barrier layer 10 and a lower barrier layer 12.

In some embodiments, carrier donor layer 22 may shape the electric field in the semiconductor structure (e.g., in the channel region). The doping density may be tuned as needed to shape the electric field. In some embodiments, carrier donor layer 22 may be used as a passivation layer. Carrier donor layer 22 may have any suitable thickness. In some embodiments, the thickness of carrier donor layer 22 may be greater than 5 nm.

Figure 2A:
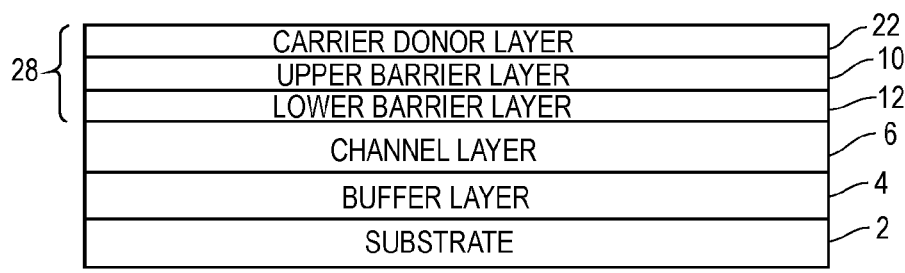
FIGS. 2A, 2B, 2C, and 2D show a semiconductor structure with a carrier donor layer and an etching process for forming a recess in the semiconductor structure, according to one embodiment of the present invention.
Figure 2B:
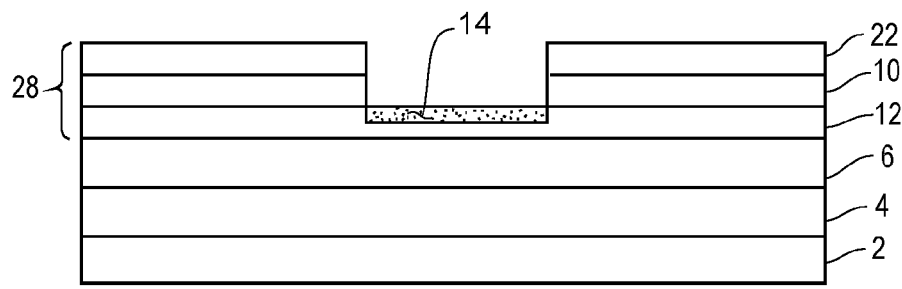
Figure 2C:
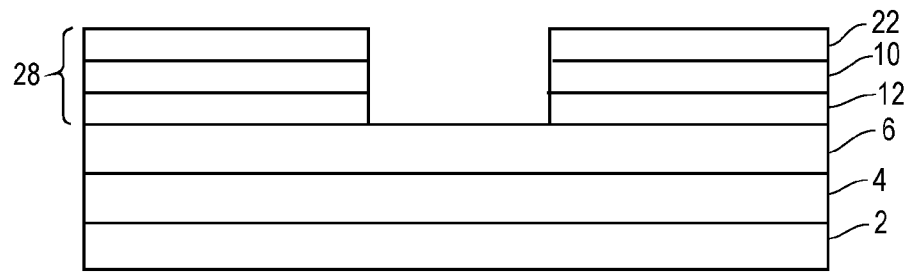
Figure 2D:
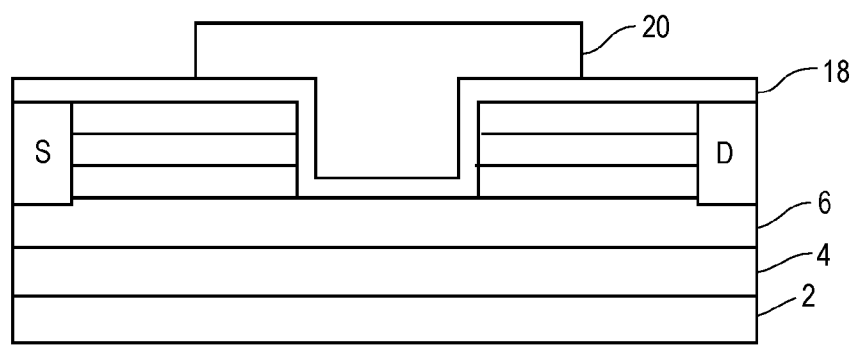

As shown in FIG. 2B, a first etching process, such as a dry etching process, may be used to etch away regions of carrier donor layer 22 and upper barrier layer 10. A region of the lower barrier layer 12 may be removed using a wet etching process, as illustrated in FIG. 2C. A gate dielectric 18 and gate 20 may be formed in the gate recess, as illustrated in FIG. 2D. Source and drain regions S and D of the transistor may be formed as well.

In some embodiments, a semiconductor structure may include a band offset layer 32 between channel layer 6 and lower barrier layer 12. Band offset layer 32 may increase the band offset between a barrier layer 38 and channel layer 6. As shown in FIGS. 3A-3D, barrier layer 38 may include an upper barrier layer 10, a lower barrier layer 12 and a band offset layer 32.

Figure 3A:
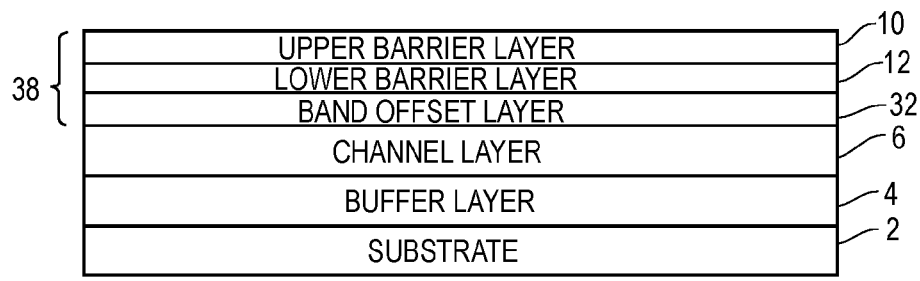
FIGS. 3A, 3B, 3C, and 3D show a semiconductor structure with a band offset layer and an etching process for forming a recess in the semiconductor structure, according to one embodiment of the present invention.
Figure 3B:
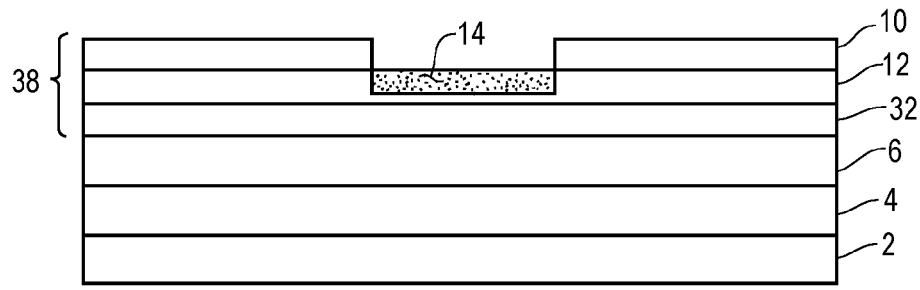
Figure 3C:
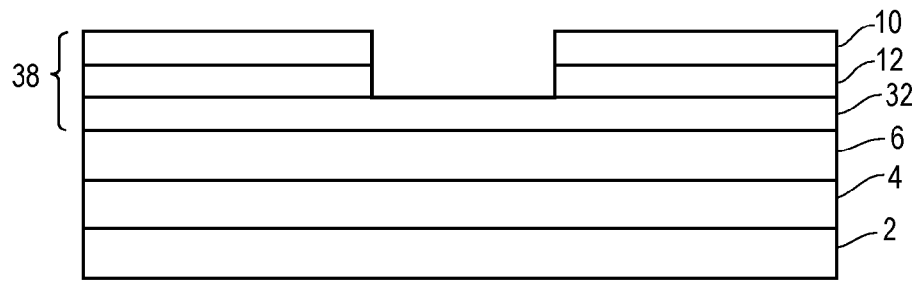
Figure 3D:
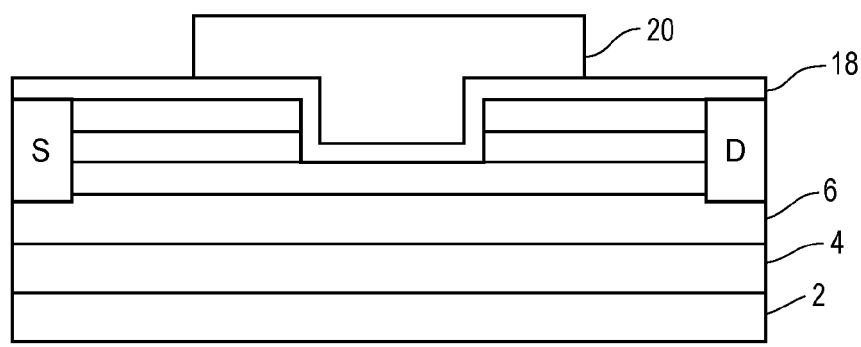

As shown in FIG. 3B, a first etching process, such as a dry etching process, may be used to etch away a region of upper barrier layer 10. A region of lower barrier layer 12 may then be removed using a wet etching process, as illustrated in FIG. 3C. In some embodiments, band offset layer 32 may be very thin, with a thickness below a critical thickness so as to produce a normally-off transistor when a gate is formed over band offset layer 32. In some embodiments, band offset layer 32 may be thicker than the critical thickness. When band offset layer 32 is thicker than the critical thickness, a normally-off transistor may be produced by removing at least a portion of band offset layer 32 using the wet etching process such that the remaining portion has a thickness below the critical thickness. A gate dielectric 18 and gate 20 may be formed in the gate recess, as illustrated in FIG. 3D. Source and drain regions S and D of the transistor may be formed. Optionally, an embodiment as illustrated in FIGS. 3A-3D may include a carrier donor layer 22 (not shown in FIGS. 3A-3D).

Figure 4:
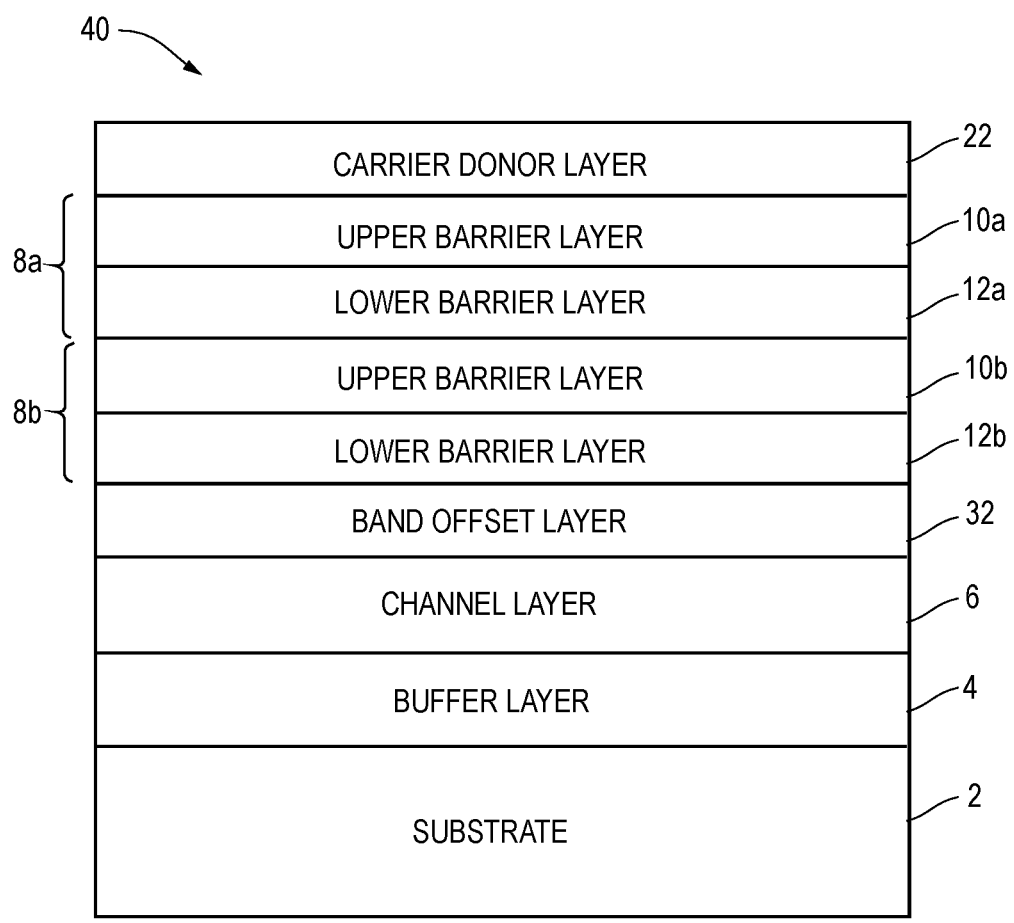
FIG. 4 shows a semiconductor structure with a plurality of dual layer barrier structures, according to one embodiment of the present invention.

In some embodiments, a semiconductor structure may include a plurality of "dual-layer" barrier structures. Any suitable number of "dual-layer" barrier structures may be included. For example, as illustrated in FIG. 4, a semiconductor structure 40 may include a first dual-layer barrier structure 8a and a second dual-layer barrier structure 8b, each having an upper barrier layer 10 and a lower barrier layer 12. The upper and lower barrier layers are indicated in FIG. 4 as 10a and 12a, respectively, for dual-layer barrier structure 8a, and indicated as 10b and 12b, respectively, for dual-layer barrier structure 8b. Dual-layer barrier structures 8a and 8b may have the same structure and/or composition, or a different structure and/or composition. To form a recess such as a gate recess, a first etching process (e.g., a dry etching process) may be performed to remove a region of layer 10a, then a second etching process (e.g., a wet etching process) may be performed to remove a region of layer 12a. Then, the first etching process (e.g., a dry etching process) may be performed to remove a region of layer 10b, and the second etching process (e.g., a wet etching process) may be performed to remove a region of layer 12b. A gate dielectric 18 and gate 20 may be formed in the gate recess, as discussed above. Source and drain regions S and D of the transistor may be formed as well. A band offset layer 32 and/or a carrier donor layer 22 may be included in the semiconductor structure 40. However, the techniques described herein are not limited in this respect, as a band offset layer 32 and carrier donor layer 22 are optional.

Descriptions as provided above are techniques for forming a recess that may be applied to form a gate recess of a transistor. Such techniques may be applied to any suitable type of transistors, including any type of field effect transistors such as MISFETs (Metal-Insulator Semiconductor Field Effect Transistors), and MESFETs (Metal-Semiconductor Field Effect Transistors).

The techniques described herein are not limited to techniques for forming a gate-recess. Such techniques may be used any other application where a damage-free, uniform and/or reproducible etch is desired. One example is the formation of ohmic recesses to reduce ohmic contact resistance and/or to form gold-free ohmic contacts. Another example is the formation of one or more recesses to access the n-doped layer in a GaN light emitting diode or laser. A further example is the formation of one or more recesses to access the base and/or collector layers in a III-N bipolar transistor.

Figure 5:
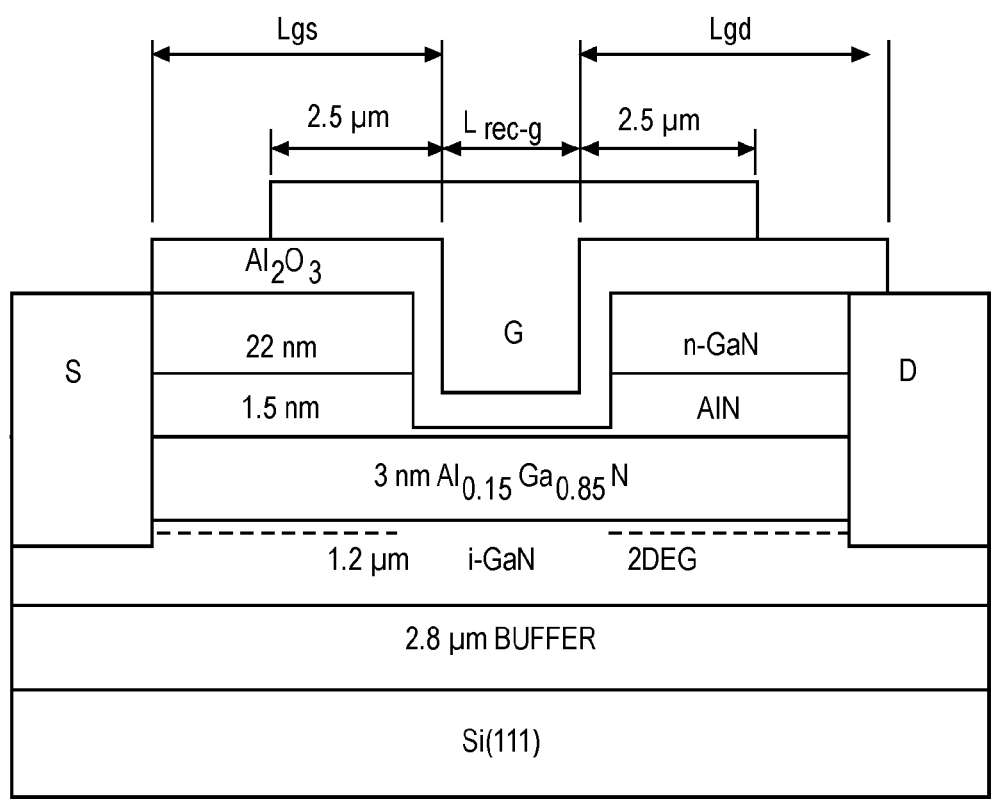
FIG. 5 shows the structure of an exemplary transistor, according to one embodiment of the present invention.

FIG. 5 illustrates a non-limiting example of transistors with gate recesses produced according to at least some of the techniques described herein. In this exemplary embodiment, upper barrier layer 10 may be formed of GaN, lower barrier layer 12 may be formed of AlN, and band offset layer 32 may be formed of $Al_{0.15}Ga_{0.85}N$. The GaN upper barrier layer can be selectively etched over the AlN lower barrier layer by fluorine-based dry etching. The AlN lower barrier layer can be selectively etched over the GaN upper barrier layer and the $Al_{0.15}Ga_{0.85}N$ band offset layer by a wet etching process with a base such as potassium hydroxide (KOH) and/or tetramethylammonium hydroxide (TMAH), or by a digital etching process. Digital etching processes are understood by those of ordinary skill in the art and will not be detailed herein. However, these are only examples, and any suitable etchants may be used.

FIG. 5 shows a structure 500 of the exemplary transistor, according to some embodiments of the present invention. Exemplary devices have been fabricated having the structure shown in FIG. 5. The structure was grown on a 4-inch silicon substrate by metal-organic chemical vapor deposition. The structure includes a 22-nm GaN: Si cap layer with $3-6 \times 10^{18}$ $cm^{-3}$ Si doping, a 1.5-nm barrier AlN layer, a 3-nm $Al_{0.15}Ga_{0.85}N$ band offset layer, a 1.2-μm i-GaN channel layer, and a 2.8-μm buffer layer on p-type Si(111) substrate. Hall measurement shows a sheet resistance of 579±1 Ω/sq and two-dimensional-electron-gas (2 DEG) mobility of 1529±18 $cm^2 \cdot V^{-1} \cdot s^{-1}$ with a sheet charge density of $7.1 \pm 0.1 \times 10^{12}$ $cm^{-2}$. The device fabrication started with mesa isolation and Ti/Al/Ni/Au ohmic contact formation which was annealed at 870° C. for 30 s. To fabricate the recessed-gate transistors, the n-GaN cap in the recessed-gate region was selectively etched over the AlN layer by fluorine-based electron-cyclotron-resonance reactive ion etching (ECR-RIE). Due to the non-volatility of aluminum fluoride ($AlF_3$), very high etch selectivity of GaN over AlN is achieved for the gas flow rates of 5 sccm $BCl_3$/35 sccm $SF_6$ at 35 mtorr, 100 W ECR power and 100 V DC bias. A 350 second etch with 70 second over-etching was used to achieve uniform and complete removal of the n-GaN layer. The surface of the AlN layer was then oxidized by low-energy oxygen plasma and wet etched by a 1-min dip in tetramethylammonium hydroxide (TMAH) at room temperature to remove the dry etching damage. The presence of fluorine from the dry-etch step was significantly reduced after the TMAH wet etch. After UV ozone and HCl surface cleaning, a 10-nm $Al_2O_3$ gate dielectric was then deposited by atomic layer deposition at 250° C. and annealed at 500° C. for 1 min in forming gas. A Ni/Au gate electrode was deposited covering the recessed-gate region with a 2.5-μm overhang length, as shown in FIG. 5B. The sample was then annealed in forming gas at 400° C. for 5 min to reduce the positive fixed charge in $Al_2O_3$. The resulting recessed-gate transistors have recessed-gate lengths $L_{rec-g}$ varying from 3 to 20 μm.

The DC (direct current) characteristics of the recessed-gate GaN MISFET 500 may be studied. Device threshold voltage $V_T$ may be defined as $V_T = V_{gsi} - 0.5 V_{ds}$, where $V_{gsi}$ is the interception voltage from a linear extrapolation of an $I_d$-$V_{gs}$ curve, not shown here. A small drain voltage ($V_{ds}$=0.1 V) may be applied to place the device in a linear operation region. Averaging over 13 devices, the recessed-gate GaN MISFETs have a uniform $V_T$ of 0.30±0.04 V. The average subthreshold slope is 62±1 mV/decade. A bidirectional gate voltage sweep in the transfer characteristics shows less than 10 mV hysteresis in the threshold voltage. The recessed-gate transistor has a similar on-resistance ($R_{on}$=10 Ω·mm) as a planar gate transistor with the same source-to-drain distance (Lsd=11 μm). The relatively low maximum drain current of both recessed-gate and planar gate transistors is due to the large gate length and gate-to-source distance, relatively low 2DEG density ($7.1 \times 10^{12}$ cm−2), and high contact resistance (1.2 Ω·mm) of the non-optimized ohmic contact.

Figure 6A:
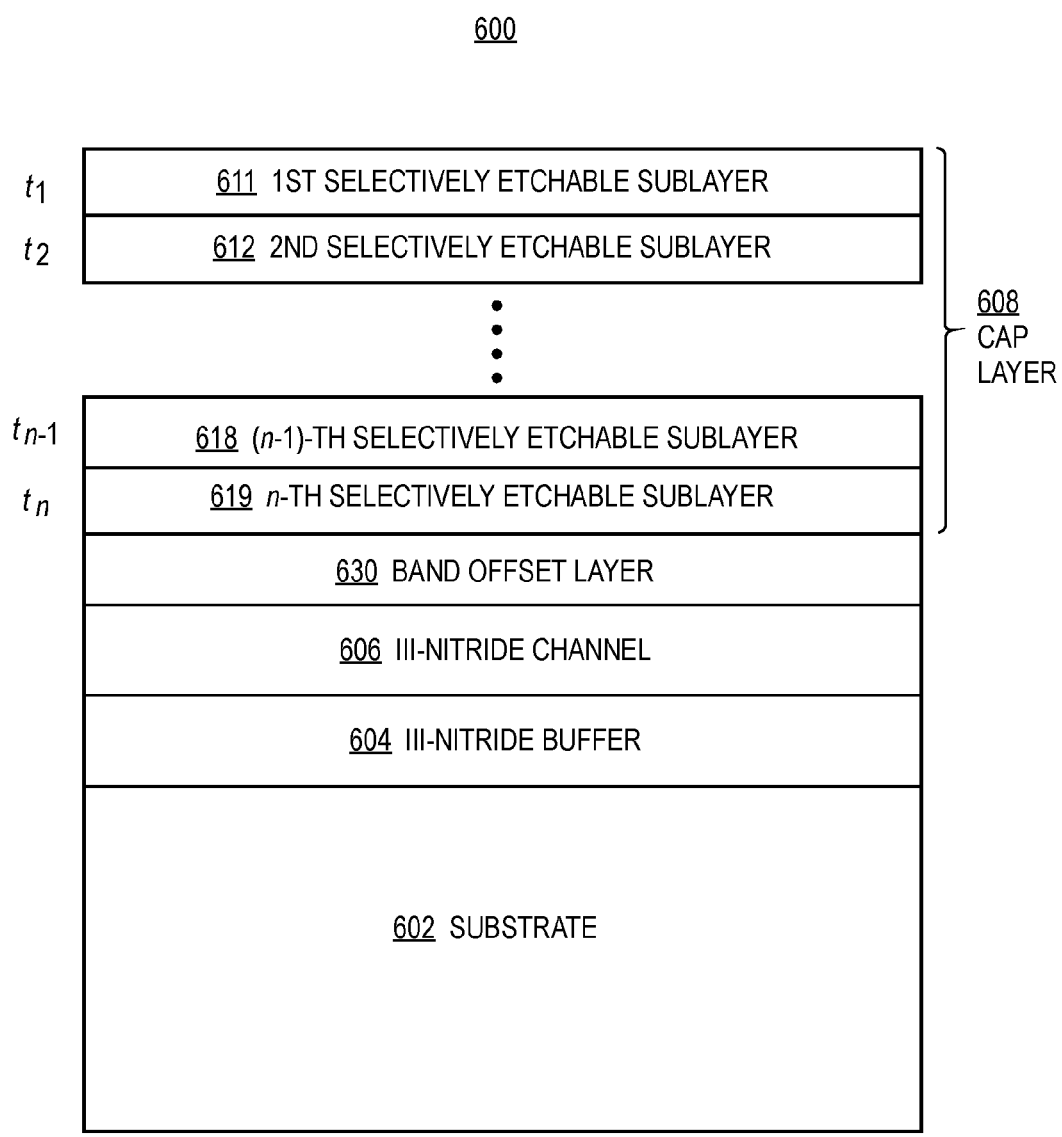
FIG. 6A shows a semiconductor structure with a cap layer comprising multiple selectively etchable sublayers, according to one embodiment of the present invention.

FIG. 6A shows another multi-layer epitaxy structure 600 further extending the "dual layer" barrier structure 40 shown in FIG. 4. Both semiconductor structure 40 and semiconductor structure 600 may be used for fabricating multiple types of transistors with different threshold voltages ($V_T$). The threshold voltage of a transistor is a gate voltage past which the transistor is turned from an on-state to an off-state, or vice versa. Semiconductor structure 600 may include a substrate layer 602, a buffer layer 604, a channel layer 606, a band-offset layer 630 and a cap layer 608. Each of substrate layer 602, buffer layer 604, channel layer 606, and band-offset layer 630 may be formed using materials and processes similar for substrate layer 2, buffer layer 4, channel layer 6, and band-offset layer 32 respectively, according to descriptions of embodiments shown in FIGS. 1A-1D, 2A-3D, 3A-3D, and 4. Cap layer 608 may be formed using materials and processes similar for barrier layer 8 or barrier layer 28, according to descriptions of embodiments shown in FIGS. 1A-1D, 2A-3D, 3A-3D, and 4.

Figure 6B:
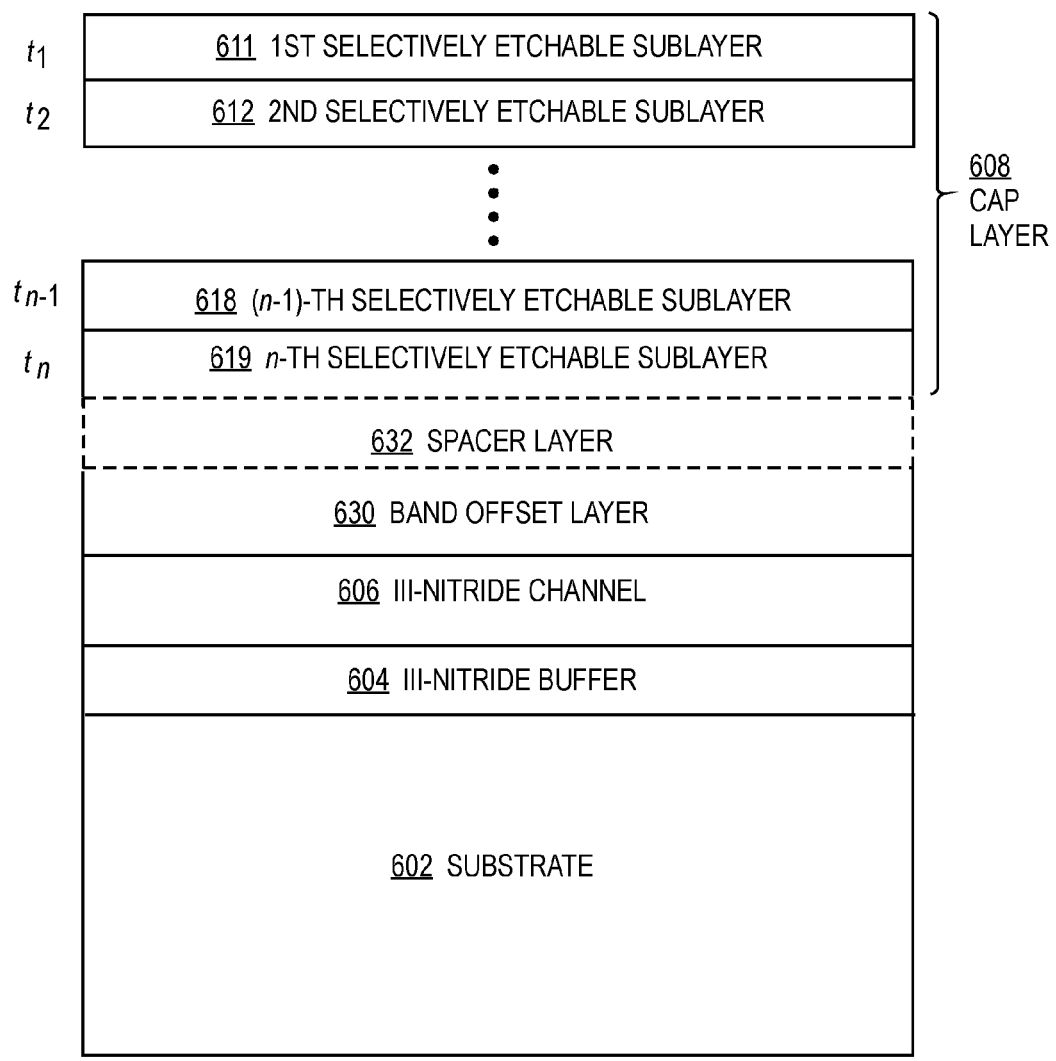
FIG. 6B shows a semiconductor structure with a spacer layer, according to one embodiment of the present invention.

FIG. 6B shows another multi-layer epitaxy structure 650, with an additional optional spacer layer 632 disposed on band-offset layer 630.

Instead of pairs of upper and lower barrier layers, epitaxy structure 600 includes a cap layer 608 comprising a plurality of n selectively etchable sublayers, such as sublayer 611 with thickness $t_1$, sublayer 612 with thickness $t_2$, sublayer 618 with thickness $t_{n-1}$, and sublayer 619 with thickness $t_n$, where n may be any even or odd integer greater than or equal to two, according to various embodiments of the present invention. For example, a multi-layer semiconductor structure 600 with a cap layer 608 having n=4 sublayers and an optional carrier donor layer is the illustrative semiconductor structure 40 shown in FIG. 4. Thickness $t_1, t_2, \ldots, t_n$ may be between 2 angstroms and 500 nanometers, and may or may not be the same in various embodiments of the present invention. For example, $t_n$ may be greater than or equal to the total thickness of all other sublayers. In another example, all odd-numbered or odd sublayers may be grown to a first thickness, while all even-numbered or even sublayers may be grown to a second thickness. Optional spacer layer 632 shown in FIG. 6B may have a thickness less than or equal to 20 nm. In various embodiments, thickness of a layer or sublayer may refer to an average, maximum, or medium vertical distance measured between points on an upper interface and a lower interface of the layer or sublayer.

In some embodiments, each i-th sublayer (1≤i<n) is selectively etchable with respect to the (i+1)-th sublayer below using some etching technique, thus the (i+1)-th sublayer below may serve as an etch stop for the i-th sublayer under the given etching technique. The n-th sublayer may further be selectively etchable with respect to band-offset layer 630, spacer layer 632, or any layer disposed directly below and/or in contact with the n-th sublayer. Spacer layer 632 may or may not be selectively etchable over band offset layer 630. In some embodiments, each sublayer is selectively etchable with respect to both the sublayer above and the sublayer below using some etching technique, such as dry etching, wet etching, or a combination of dry etching and wet etching. For example, selectively etchable sublayers may be classified into two types. All odd sublayers counting from the first sublayer 611 may be formed of a material that is selectively etchable with respect to even sublayers by a first etching technique, such as dry etching, while all even sublayers counting from the second sublayer 612 may be formed of a material that is selectively etchable with respect to odd sublayers by a second etching technique, such as wet etching, or vice versa. The n-th sublayer may further be selectively etchable with respect to band-offset layer 630, spacer layer 632, or any layer disposed directly below and/or in contact with the n-th sublayer. Spacer layer 632 may or may not be selectively etchable over sublayer 619 and/or band offset layer 630. Band offset layer 630 may or may not be selectively etchable over sublayer 619 and/or band spacer layer 632. Each of the odd sublayers may have the same structure, composition, and/or thickness. Alternatively, each of the odd sublayers may have a different structure, composition, and/or thickness. Similarly, each of the even sublayers may have the same structure, composition, and/or thickness, or a different structure, composition, and/or thickness. In yet some other embodiments, each sublayer may be selectively etchable with respect to a selected subset of all other sublayers, using one or more etching techniques. For example, in some embodiments, selectively etchable sublayers may be classified into three types, where each type is repeated every three sublayers, and where each type is selectively etchable over the other two types using one or more etching techniques.

More specifically, as discussed with respect to FIG. 1A, selective etchability of sublayers within cap layer 608 may be achieved by alternating sublayer material between two or more types of compositions. In some embodiments, all odd sublayers counting from the first sublayer 611 may include or comprise a semiconductor material that is selectively etchable in a dry etching process, such as GaN, or another nitride semiconductor material $B_wAl_xIn_yGa_zN$, in which w, x, y and z each has a suitable value between zero and one inclusive (0≤w, x, y, z≤1), and the composition is such that the nitride semiconductor material is selectively etchable using a dry etching process. In one example, odd sublayers may be formed of a semiconductor material $B_wAl_xIn_yGa_zN$ where x is less than 0.25. In different embodiments, the values of w, x, y, and z may or may not add to 1. In some embodiments, odd sublayers may be formed of a semiconductor material $Al_xIn_yGa_zN$ in which x, y, and z each has a suitable value between zero and one inclusive (0≤x, y, z≤1), and where the values of x, y, and z may or may not add to 1. Similarly, all even sublayers counting from the second sublayer 612 may include or comprise a semiconductor material that is selectively etchable in a wet etching process, such as AlN, or another nitride semiconductor material $B_wAl_xIn_yGa_zN$, in which w, x, y and z each has a suitable value between zero and one inclusive (0≤w, x, y, z≤1), and the composition is such that the nitride semiconductor material is selectively etchable using a wet etching process. The values of w, x, y, and z may or may not add to 1. In one example, even sublayers may be formed of a semiconductor material $B_wAl_xIn_yGa_zN$ where x is greater than 0.5. In some embodiments, even sublayers may be formed of a semiconductor material $Al_xIn_yGa_zN$ in which x, y, and z each has a suitable value between zero and one inclusive (0≤x, y, z≤1), and where the values of x, y, and z may or may not add to 1. In those embodiments, at least one of the selectively etchable sublayers may have a non-zero Ga content (0<z≤1) that makes the epitaxy growth process easier. When consecutive, adjacent or continuous sublayers of cap layer 608 have their material compositions alternate between GaN and AlN, fluorine-based chemicals may be used to dry etch GaN without etching AlN, while tetramethylammonium hydroxide (TMAH) may be used to wet etch AlN without etching GaN. In some embodiments, odd layers may include or comprise a semiconductor material that is selectively etchable in a wet etching process, such as AlN, while even layers may include or comprise a semiconductor material that is selectively etchable in a dry etching process, such as GaN.

The reference herein to $B_wAl_xIn_yGa_zN$ or a "$B_wAl_xIn_yGa_zN$ material" refers to a semiconductor material having nitride and one or more of boron, aluminum, indium and gallium. An $Al_xIn_yGa_zN$ material is a $B_wAl_xIn_yGa_zN$ material where w=0. Examples of $B_wAl_xIn_yGa_zN$ materials include, but are not limited to, GaN, AlN, AlGaN, AlInGaN, InGaN, and BAlInGaN, $Al_{0.15}Ga_{0.85}N$, and $Al_{0.65}Ga_{0.35}N$, by way of illustration. A $B_wAl_xAl_yGa_zN$ material may include other materials besides nitride, boron, aluminum, indium and/or gallium. For example, a $B_wAl_xIn_yGa_zN$ material may be doped with a suitable dopant such as silicon or germanium.

In some embodiments, selective etchability of sublayers within cap layer 608 is achieved by alternating aluminum content or composition of adjacent or consecutive sublayers between a relatively high value or percentage and a relatively low value or percentage. In other words, selective etchability may be achieved by alternating between Al-light and Al-rich sublayers, or adjusting the value of x for material $B_wAl_xIn_yGa_zN$ or $Al_xIn_yGa_zN$ as described above. In one example, consecutive or adjacent sublayers of cap layer 608 may have Al contents alternating between less than 0.5 inclusive and greater than 0.5 exclusive, less than 0.5 exclusive and greater than 0.5 inclusive, or less than 0.5 exclusive and greater than 0.5 exclusive. In other examples, consecutive or adjacent sublayers of cap layer 608 may have Al content alternate between less than 0.25 and greater than 0.5, less than 0.35 and greater than 0.5, or less than 0.35 and greater than 0.65, inclusive or exclusive. In some embodiments, at lest one of the plurality of selectively etchable sublayers has an Al content great than 0.5. In addition, at least one of the selectively etchable sublayers may have a non-zero Ga content (0<z≤1). Moreover, B, Al, In, and Ga compositions in each type of sublayers may not necessarily be the same. For example, when n is odd, first sublayer 611 and n-th sublayer 619 may have x=0.1 and x=0.2 respectively, while second layer 612 and (n−1)-th sublayer 618 may have x=0.6 and x=0.7 respectively. Similarly, when n is even, first sublayer 611 and (n−1)-th sublayer 618 may have x=0.1 and x=0.2 respectively, while second sublayer 612 and n-th sublayer 619 may have x=0.6 and x=0.7 respectively.

Figure 7:
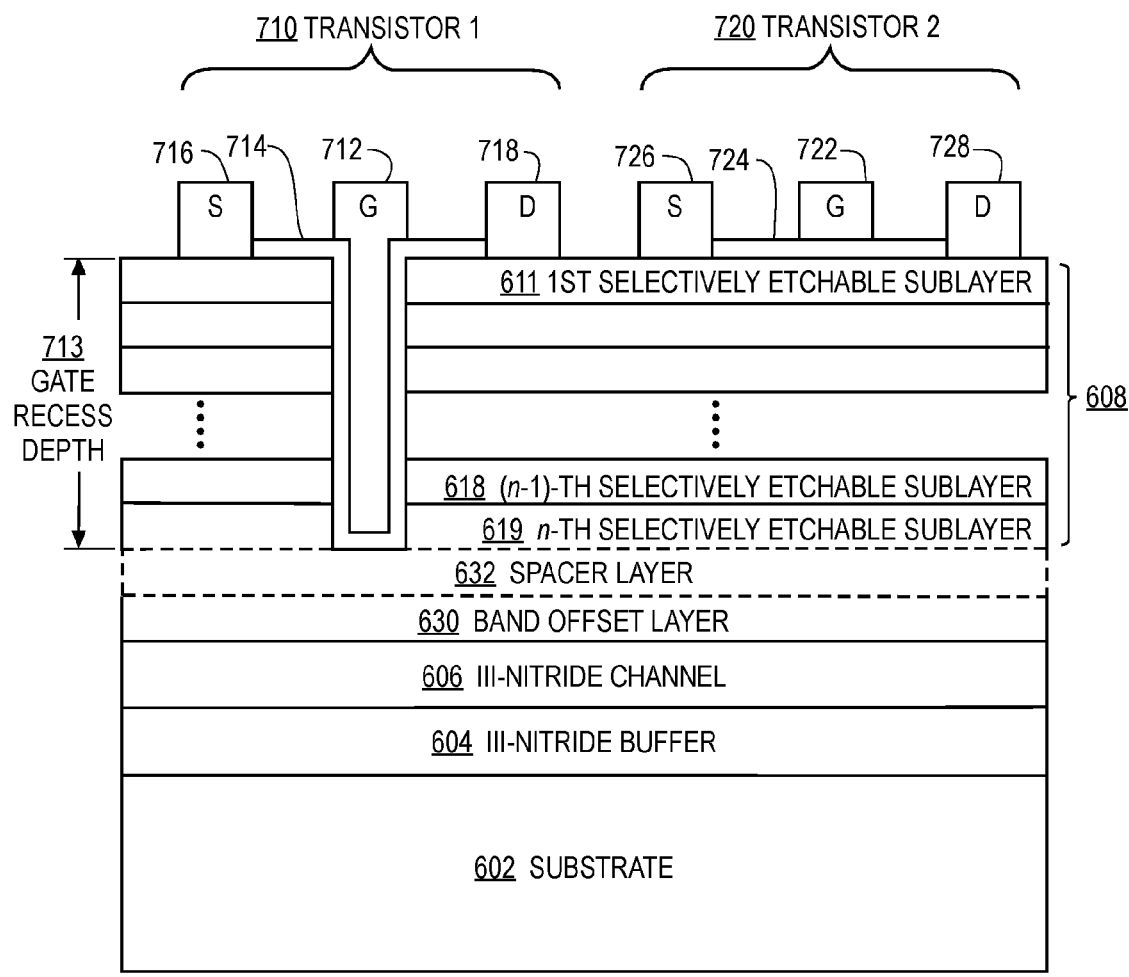
FIG. 7 shows an exemplary structure with a recessed-gate transistor and a planar-gate transistor, according to one embodiment of the present invention.

FIG. 7 illustrates a non-limiting exemplary structure 700 containing two types of transistors produced on a common substrate, using epitaxy structure 600 shown in FIG. 6A, or epitaxy structure 650 shown in FIG. 6B, with a gate recess produced according to some of the techniques described herein. More specifically, semiconductor structure 700 includes two transistors 710 and 720. Transistor 710 is gate-recessed and includes a gate 712 with gate recess depth 713, through the entire cap layer 608. Transistor 720 has a planer gate. In some embodiments, gate 712 may be recessed through a proper subset of the selectively etchable sublayers, so cap layer 608 is not removed entirely for forming gate 712, as shown in FIG. 7.

Similar to the exemplary transistor shown in FIG. 5, when the vertical thickness between the gate recess and channel layer 606 is below a critical thickness, a normally-off E-mode transistor is formed with a positive threshold voltage $V_{T1}$. On the other hand, planar transistor 720 is a normally-on D-mode transistor with a negative threshold voltage $V_{T2}$. Generally, transistor threshold voltage depends monotonically on gate-recess depth, or the number of sublayers etched under the gate, where the dependence may be linear or nonlinear. The threshold voltage also depends on the type of materials and compositions in the sublayers etched. For example, while alternating Al contents enables selective etchability of one sublayer over another, a higher average Al content for cap layer 608 generally moves the threshold voltage of a transistor fabricated thereon negatively. Hence, given a desired threshold voltage, etching selectivity between different semiconductor materials for individual sublayers may be taken into account when determining the corresponding gate recess depth. On the other hand, once sublayers are grown, etching depths can be accurately controlled in discrete steps to achieve or approximate a desired threshold voltage.

The E/D-mode integration shown in FIG. 7 may offer a large difference in threshold voltages between the two types of transistors. In some embodiments, the difference in threshold voltages between the two types of transistors may be as large as 35V. In some embodiments, both transistors may be E-mode transistors, with different positive threshold voltages, or both transistors may be D-mode transistors, with different negative threshold voltages. In some embodiments, $V_{T1}$ and $V_{T2}$ may be within the range between −10V and +3V, respectively. In some embodiments, a portion of optional spacer layer 632, all of spacer layer 632, a portion of band-offset layer 630, and/or all of band-offset layer 630 may be removed to further increase gate recess depth 713, to achieve a higher threshold voltage $V_{T1}$. In other words, the bottom of the gate recess for transistor 710 may be within or on band-offset layer 630, spacer layer 632, or any sublayer of cap layer 608.

To form a recess such as the gate recess for transistor 710, a suitable masking process may be used to define a region to be etched. A first etching process may be performed to selectively etch the material of first selectively etchable layer 611 with respect to the material of second selectively etchable layer 612. The selectivity of the etch process used in the first etching step may be greater than one, such that first selectively etchable layer 611 is etched at a faster rate than second selectively etchable layer 612. In some embodiments, the selectivity of the etch process used in the first etching step may be greater than 3:1, such that first selectively etchable layer 611 is etched at a rate greater than three times as high as the rate at which second selectively etchable layer 612 is etched. The first etching technique may include a dry etching technique (e.g., dry plasma etching, or reactive ion etching (RIE)). If first selectively etchable layer 611 includes GaN, a fluorine-based etching process may be used. Second selectively etchable sublayer 612 may serve as an etch stop to stop the dry etching process at its upper surface. The dry etching process may damage the upper surface of second selectively etchable sublayer 612, creating a damaged region. However, in some embodiments the dry etching process may not produce any significant damage.

Next, a second etching step may be performed using a second etching technique to remove a portion of second selectively etchable sublayer 612, through a window formed by the removal of a region of first selectively etchable sublayer 611 in the first etching step. In some embodiments, the etch process used in the second etching step may selectively etch second selectively etchable sublayer 612 with respect to a layer overlying second selectively etchable sublayer 612 and which may be in contact with second selectively etchable sublayer 612, such as first selectively etchable sublayer 611, for example. In some embodiments, the etch process used in the second etching step may selectively etch second selectively etchable sublayer 612 with respect to a layer below second selectively etchable sublayer 612 which may be in contact with second selectively etchable sublayer 612, such a third selectively etchable sublayer below, and/or spacer layer 632, or band offset layer 630. The selectivity of the etching of second selectively etchable sublayer 612 with respect to first selectively etchable sublayer 611 and/or the third selectively etchable sublayer, spacer layer 632, or band offset layer 630 may be greater than one, such that the rate of etching of second selectively etchable sublayer 612 is greater than that of first or third selectively etchable sublayers, for example. In some embodiments, the selectivity may be greater than 3:1, such that second selectively etchable sublayer 612 is etched at a rate greater than three times as high as the first or the third selectively etchable sublayers. In some embodiments, the etching technique used in the second etching step may be a wet etching technique.

Once the gate recess is formed through first selectively etchable sublayer 611 and second selectively etchable sublayer 612, the first and second etching techniques, or dry etching and wet etching processes as discussed above, may be performed iteratively to remove consecutive or adjacent selectively etchable sublayers, until gate recess depth 713 is achieved. The last etching step to remove a portion of sublayer 619 may be either dry etching or wet etching. In the exemplary structure 700, gate recess depth 713 is approximately the summation of layer thicknesses $t_1, t_2, \ldots$, and $t_n$. Gate dielectric 714 and gate 712 may be formed in the resulting gate recess for transistor 710, using processes similar to those for depositing gate dielectric 18 and gate 20 shown FIG. 1D. For planar-gate transistor 720, gate dielectric 724 and gate 722 may be formed concurrently with, or separately from, gate dielectric 714 and gate 712 of transistor 710. Source contacts 716 and 726, and drain contacts 718 and 728 may be formed before or thereafter.

Figure 8:
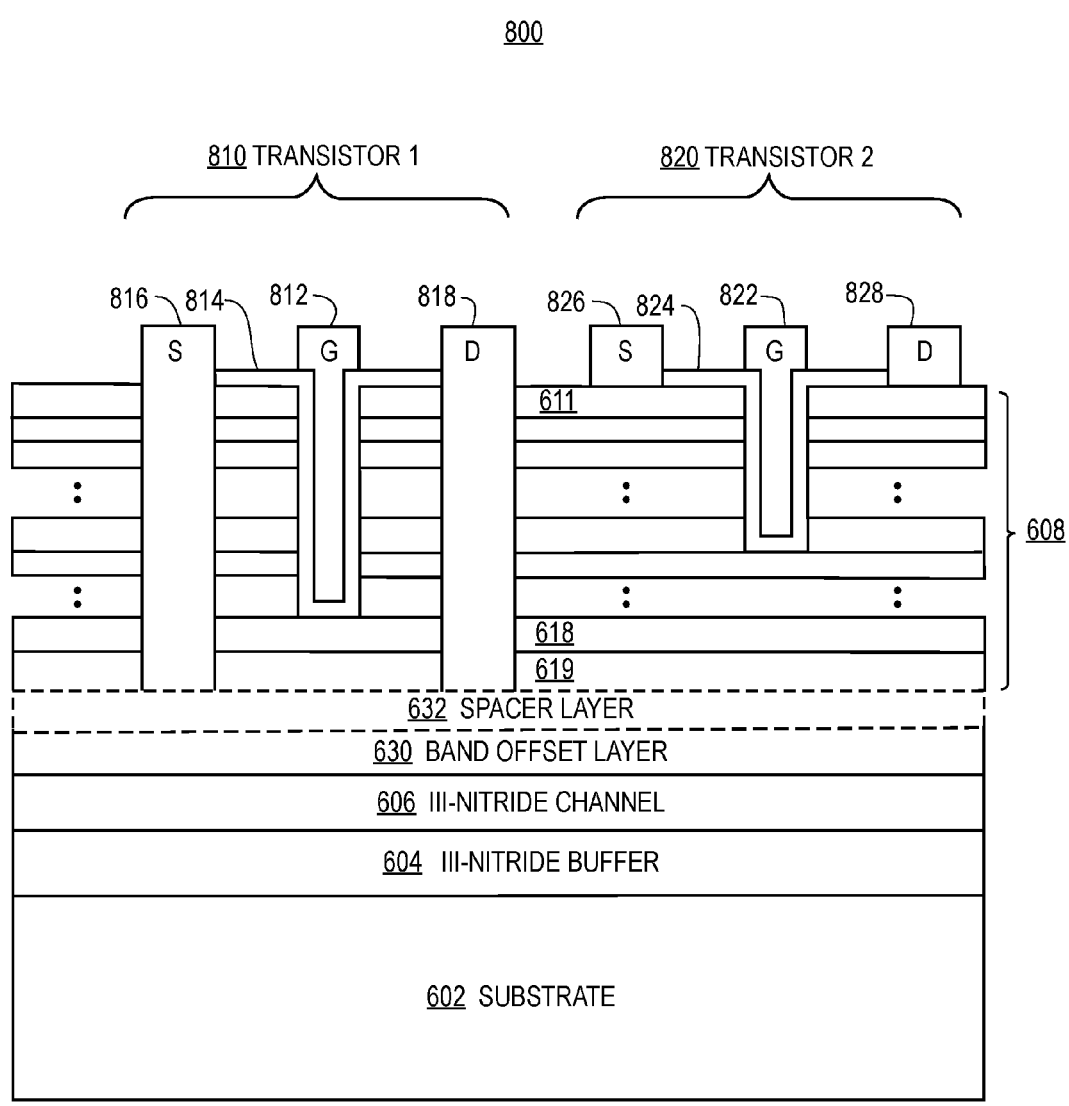
FIG. 8 shows an exemplary structure with two recessed-gate transistors, according to one embodiment of the present invention.

FIG. 8 illustrates another exemplary structure 800 containing two types of transistors 810 and 820 produced on the same substrate, using epitaxy structure 600 shown in FIG. 6A or epitaxy structure 650 shown in FIG. 6B. Transistors 810 and 820 are gate-recessed to different depths and fabricated according to techniques described herein. In this example, transistor 810 with a deeper gate recess has a more positive threshold voltage $V_T$ than transistor 820 with a shallower gate recess. As the value of transistor threshold voltage $V_T$ is monotonically dependent on gate recess depths, varying the number of sublayers etched or recessed below the gate allows direct and accurate control of achievable threshold voltages. Furthermore, as each selectively etchable sublayer may contain a mono layer of III-N atoms, recess depths may be discretely controlled at intervals as small as 0.2 nm to 0.5 nm. Gate recesses may stop in or on at any selectively etchable sublayer, spacer layer 632, or band-offset layer 630, or one or more optional carrier donor layers not shown here. In this example, gate recesses of transistors 810 and 820 stop on two different sublayers, and these two sublayers may or may not have the same material compositions. Gate dielectrics 814 and 824, and gate contacts 812 and 822 are deposited over the etched regions.

In various embodiments, ohmic contacts may be made with or without recesses, and either before or after the formation of the gate regions to accommodate for other process considerations such as thermal budget, ohmic contact performance and process complexity. In the example shown in FIG. 8, ohmic contacts 816 and 818 of transistor 810 are made with ohmic recesses into cap layer 608. Both source 816 and drain 818 are recessed through the entire cap layer, with the same ohmic recess depth to simplify fabrication. Generally, ohmic recesses for a single transistor may or may not have the same recess depth. Moreover, although ohmic contacts are rectangular shaped in FIG. 8, they may also be alloyed, in which the contacts have no regular shapes.

To fabricate structure 800 shown in FIG. 8, the bare epi surface of multi-layer structure 650 may be first covered with a dielectric layer, such as $SiO_2$ or SiN. A gate opening for transistor 810 may be defined by using photolithography, and etched in the deposited dielectric. After removal of photoresist, fluorine-based dry-etch may be performed to remove Al-light sublayers and stop on Al-rich sublayers, while TMAH or other basic solutions may be used to remove Al-rich sublayers and stop on Al-light sublayers. Selective etching may be repeated until a desired recess depth is reached for gate 812. Once the first gate recess is formed, the whole structure may be covered with another dielectric layer, generally the same as the first dielectric used before, and photolithography can be performed, followed by photoresist removal and iterative selective etching of sublayers until a desired recess depth for gate 822 is reached. After the two gate recesses are formed, gate dielectrics and gate contact materials such as gate metals may be deposited to cover the whole structure. Gate electrodes are then defined by photolithography, where gate metals outside gate electrode regions are etched off. In some embodiments, gate electrodes are formed by depositing gate electrode materials followed by lifting-off, using at least one material selected from Ti, Mo, W, Ta, Pt, Ni, poly-Si, TiN, WN, TaN, TiW, and silicide. In some embodiments, gate electrodes for different transistors are made of different materials. Another way of recessing for gate 812 and gate 822 is to define both gate openings concurrently, to selectively etch in both gate openings until a first, smaller, gate depth is reached, and to further selectively etch in one of the gate openings until a second, larger, gate depth is reached.

For ohmic contacts, ohmic recesses for contacts 816 and 818 may be formed before gate electric and gate metal deposition. For example, ohmic recesses may be formed together or concurrently with one of the gate recesses, if the recess depths are the same. Furthermore, ohmic metal deposition, patterning and optional thermal annealing steps may be performed either before or after gate dielectric and gate metal deposition, or gate electrodes formation, to allow optimization of thermal budgets and process complexities. In some embodiments, the recessed structure is subjected to a thermal annealing at a temperature below 1500° C., before gate electrode and ohmic contact deposition or formation. In some embodiments, metal layers are deposited over ohmic contacts and formed transistors, for interconnecting the ohmic contacts, or as field plates for managing electric field in the transistors.

Figure 9:
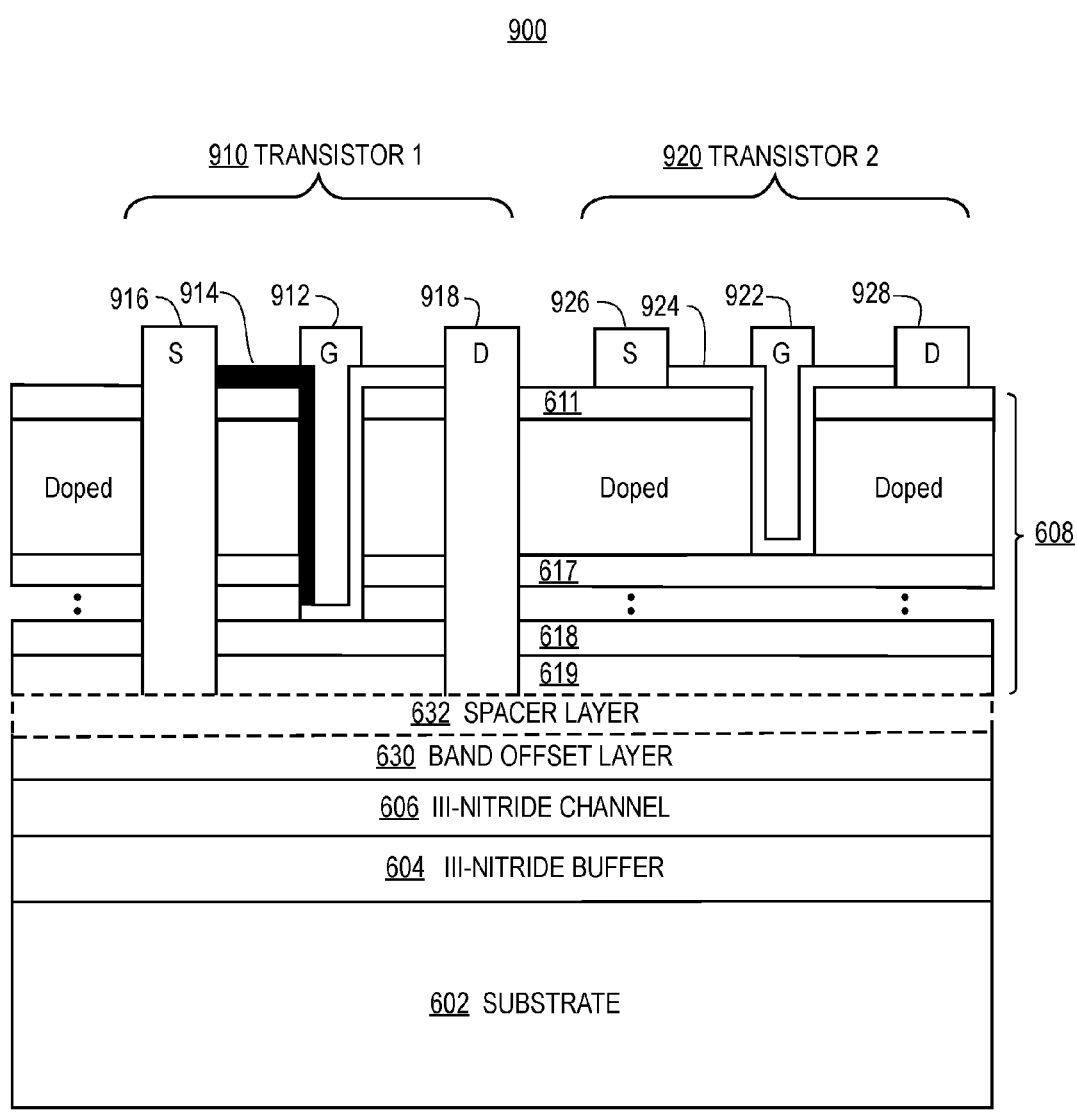
FIG. 9 shows an exemplary structure containing two recessed-gate transistors, with doped sublayers, according to one embodiment of the present invention.

FIG. 9 shows an exemplary structure 900 containing two recessed-gate transistors 910 and 920, with doped selectively etchable sublayers, according to some embodiments of the present invention. In this example, a block or set of consecutive, adjacent, or continuous sublayers between sublayers 611 and 617 (exclusive) are doped. Doping may be performed during epitaxy growth. After recess etching, doped regions are formed between the gate and the source, and between the gate and the drain, outside of the gate and ohmic recesses. In various embodiments of the present invention, any subset of the selectively etchable sublayers, continuous or discontinuous, may be doped to supply carriers to the channel layer. Depending on gate recess depths, un-etched sublayers below one or both recessed gates may be doped as well. Each doped region may be polarization doped or may include dopants such as n-type dopants or p-type dopants. Each doped selectively etchable sublayer or each doped region may have any suitable doping concentration and distribution. For example, dopants may be provided at the lower surface of a sublayer, the upper surface of a sublayer, or throughout a sublayer. The doping profile can be uniform or non-uniform. In some embodiments, a delta-doping profile may be used, through an individual sublayer, or a block of consecutive sublayers. To dope one or more sublayers, any suitable doping technique may be used, such as implantation or diffusion. In one example, a selected set of selectively etchable sublayer may be doped during the formation or growth of cap layer 608. In some embodiments, the doping type may be of the same type as that of the carriers in the channel region. For example, the doping type in doped regions shown in FIG. 9 may be n-type for an n-channel transistor, and p-type for a p-channel transistor. In some embodiments, a doped region may be highly doped. In some embodiments, additional carrier donor layers such as layer 22 as shown in FIG. 2A may be further deposited on top of or below cap layer 608. In some embodiments, a passivation layer may be deposited on top of cap layer 608, wherein the passivation material may be silicon nitride, silicon oxide, aluminum oxide, aluminum nitride, polyimide, benzocyclobutene, silicon oxynitride, aluminum oxynitride, Teflon, and phosphosilicate glass.

Figure 10:
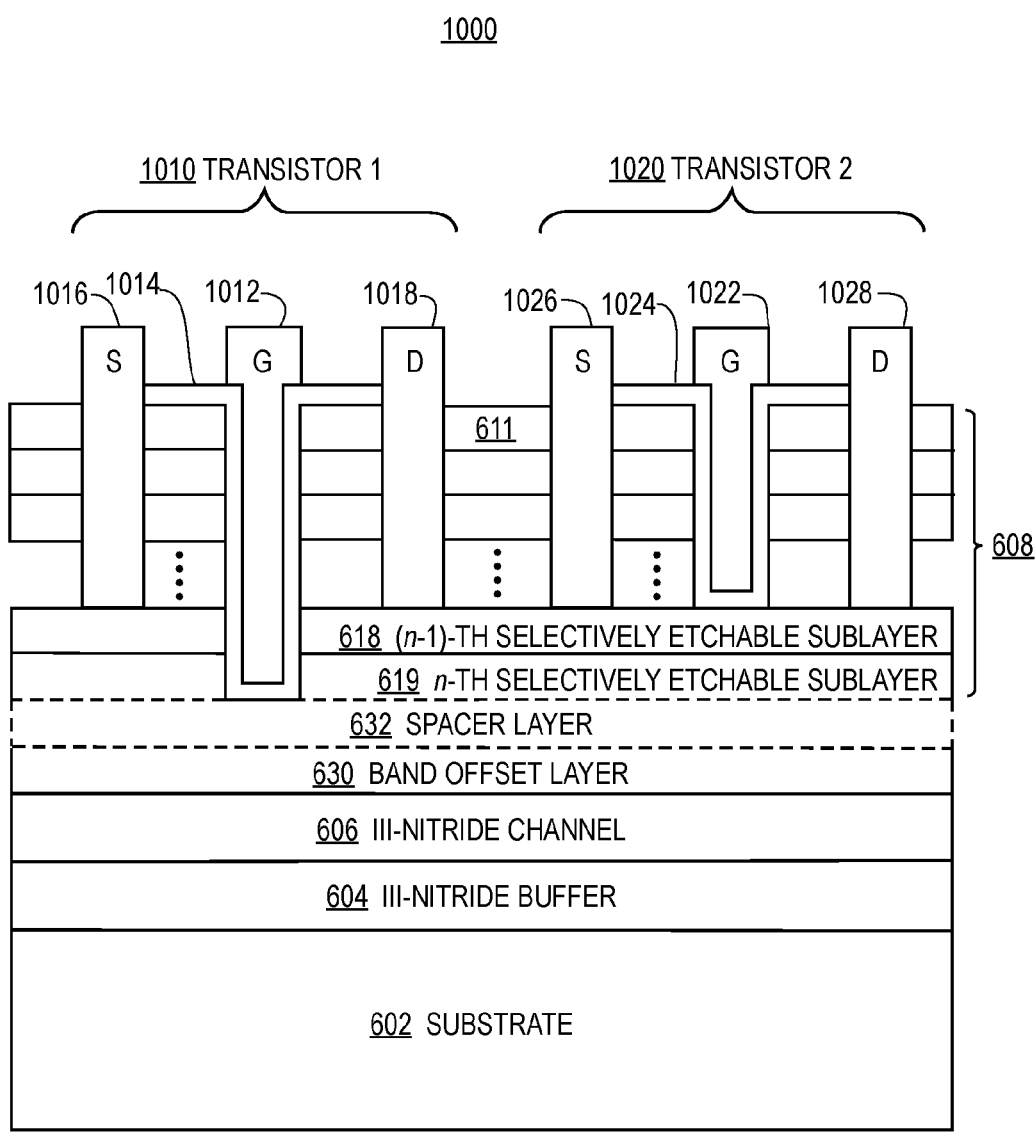
FIG. 10 shows an exemplary structure containing two recessed-gate transistors with recessed ohmic contacts, according to one embodiment of the present invention.

FIG. 10 shows yet another exemplary structure 1000 containing two recessed-gate transistors both with ohmic recesses, according to some embodiments of the present invention. In this particular example, ohmic contacts 1016 and 1018 of transistor 1010 are disposed over and cover a first pair of ohmic recesses of one depth, while ohmic contacts 1026 and 1028 of transistor 1020 are disposed over and cover a second pair of ohmic recesses of the same depth. Recessed gates 1012 and 1022 are disposed over gate dielectrics 1014 and 1024, which are in turn disposed over and cover gate recesses with different depths. In various embodiments, each ohmic region may be recessed to reach channel layer 606, band-offset layer 630, spacer layer 632, or a selectively etchable sublayer. Ohmic recesses for contacts 1016, 1018, 1026, and 1028 may be formed concurrently, since they are of the same depth. Transistors 1010 and 1020 may both be E-mode, or one may be E-mode while the other may be D-mode.

One advantage of using structures such as 900 in FIGS. 9 and 1000 in FIG. 10, with gate recesses and ohmic recesses, over a design such as structure 700 in FIG. 7, which includes a planar transistor without gate recess or ohmic recesses, is to maximize sheet electron density in access regions between gate and S/D, and to minimize sheet resistance in these regions, by retaining the maximum epi layer thickness in these access regions. In addition, trapping effect in these access regions can be mitigated, by keeping the top surfaces of these regions far away from the channel.

Although only two types of transistors are discussed in the illustrative examples shown in FIGS. 7, 8, 9 and 10, in other embodiments, multi-layer structure 600 or 650 may be configured to include more than two types of transistors, each with a different threshold voltage. At least three selectively etchable sublayers may be necessary to achieve different threshold voltages, accordingly.

While FIGS. 7, 8, 9, 10 provide illustrative examples of semiconductor structures for integrating two types of transistors with different threshold voltages on a common substrate, in some embodiments, other devices may be further integrated on the same substrate. Exemplary devices include diodes, capacitors, memories, memristors, optical modulators, waveguides, light emitting diodes, optocouplers, detectors, transformers, resistors, and inductors. In some embodiments, the semiconductor structures as described herein as used for applications including analog circuits, mixed-signal circuits, gate drive circuits, and digital control circuits.

Figure 11:
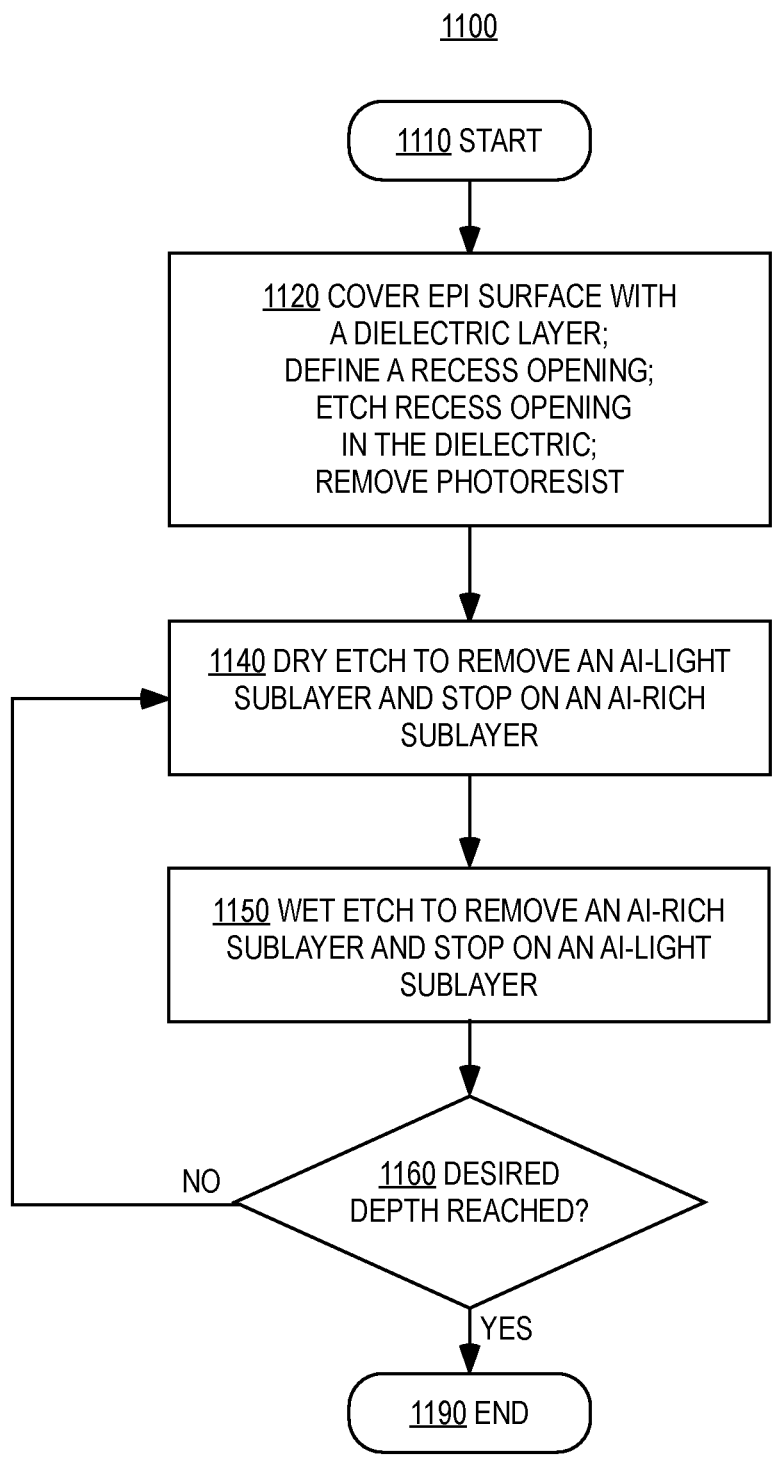
FIG. 11 shows a process for forming a recess on a semiconductors structure, according to one embodiment of the present invention.

FIG. 11 shows an exemplary process flow for forming a recess on a semiconductors structure, according to fabrication techniques as described herein. A key feature of the recess etching process as discussed is progressive removal of selectively etchable sublayers until a desired recess depth is reached. For example, to form a recess on a semiconductor structure such as 600 shown in FIG. 6A, photolithography may be first performed to define a recess opening. Next, two or more etching techniques may be iteratively applied to remove odd-numbered and even-numbered sublayers, until a desired recess depth is reached. Any block of consecutive, adjacent, or continuous sublayers may be removed in this manner.

As a more specific example, FIG. 11 shows a process flow for forming a recess on a semiconductor structure such as 600, and where odd-numbered sublayers are Al-light while even-numbered sublayers are Al-rich. For instance, odd-numbered or odd sublayers may be formed of a first semiconductor material $Al_{x1}In_{y1}Ga_{z1}N$ in which $x_1$, $y_1$, and $z_1$ each has a suitable value between zero and one inclusive ($0 \leq x_1, y_1$, and $z_1 \leq 1$), and where $x_1 \leq 0.35$; even-numbered or even sublayers may be formed of a second semiconductor material $Al_{x2}In_{y2}Ga_{z2}N$ in which $x_2$, $y_2$, and $z_2$ each has a suitable value between zero and one inclusive ($0 \leq x_2, y_z$, and $z_2 \leq 1$), and where $x_2 > 0.5$. In addition, assume that the desired recess depths cover an even total number of selectively etchable sublayers in this example. Upon initialization 1110, photolithography is first performed at step 1120. In particular, the epitaxy surface of structure 600 is first covered with a dielectric layer, and a recess opening is defined. The recess opening is etched in the dielectric and the photoresist is subsequently removed. Next, two etching techniques such as dry etching and wet etching may be iteratively applied through steps 1140 and 1150 to remove odd and even sublayers, until a desired recess depth is reached at step 1160. At step 1140, dry etching is applied to remove an Al-light sublayer and to stop on an Al-rich sublayer; at step 1150, wet etching is applied to remove an Al-rich sublayer and to stop on an Al-light sublayer. Once the desired recess depth is reached, the overall process stops at step 1190. If the desired recess depths cover an odd total number of selectively etchable sublayers, process flow 1100 may be modified accordingly so the total number of selectively etching steps is also odd.

Figure 12:
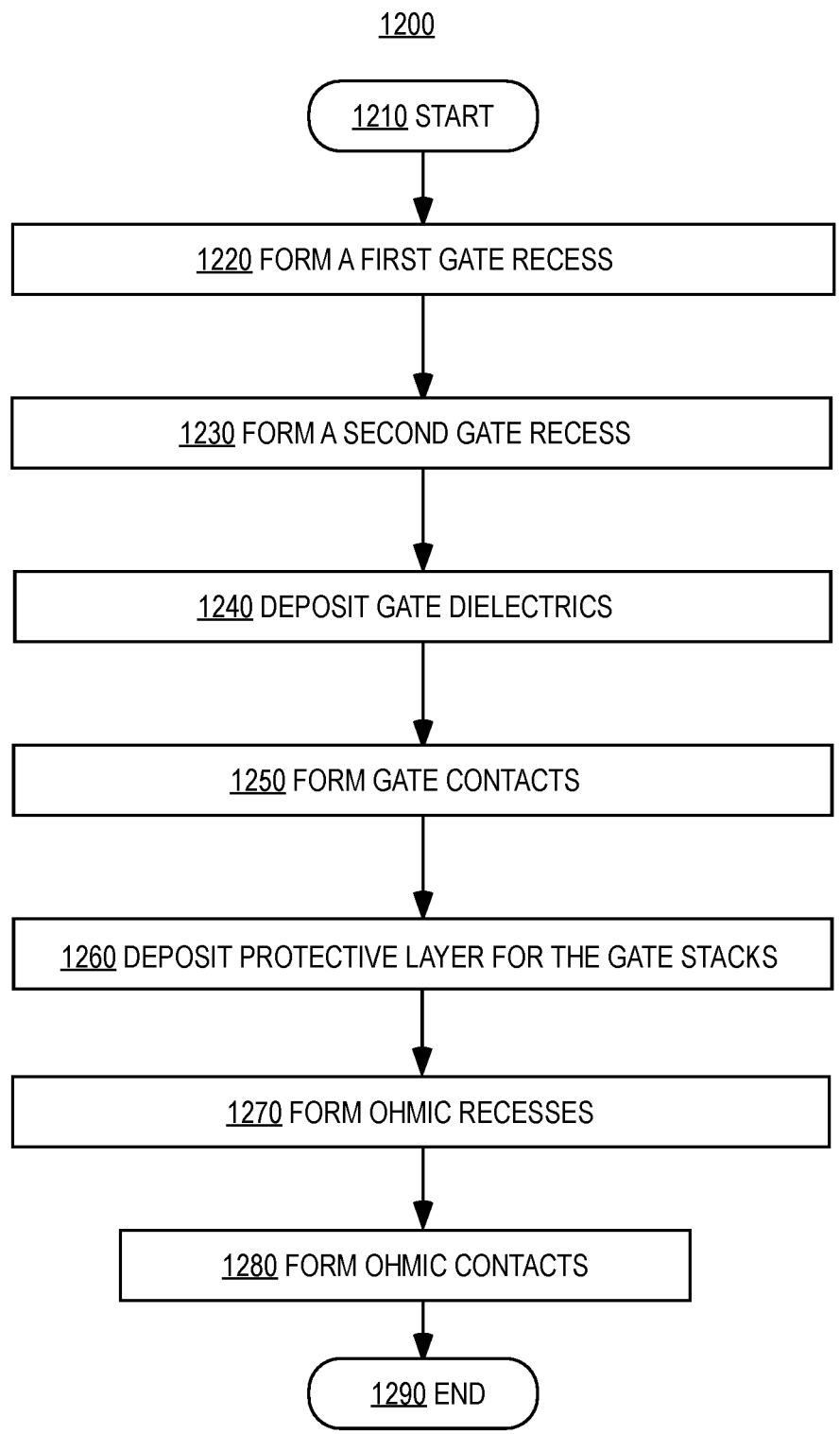
FIG. 12 shows a process for forming a structure containing two types of recessed-gate transistors, according to one embodiment of the present invention.

FIG. 12 shows an exemplary process flow for forming a structure containing two types of recessed-gate transistors according to fabrication techniques as described herein. In this example, two gate recesses are formed individually at steps 1220 and 1230, through the recess formation process shown in FIG. 11. Gate dielectrics and gate contacts may then be deposited at step 1240, and 1250. A protective layer may be deposited for the gate stacks at step 1260, before a pair of ohmic recesses is formed at step 1270. Although not shown here, a second pair of ohmic recesses may be further formed, concurrently with the first pair if both pairs have the same recess depths, or after the first pair, if the two pairs have different recess depths. Ohmic contacts are then deposited at step 1280. The overall process ends at step 1290.

FIG. 13 shows an illustrative structure 1300 with both D-mode and E-mode transistors, fabricated on a multi-layer semiconductor structure with selectively etchable sublayers, according to some embodiment of the present invention. FIG. 13 also shows corresponding transfer curves or $I_D$-$V_{GS}$ characteristics 1350 in logarithmic scale. In structure 1300, planar-gate D-mode transistors with ohmic recesses are constructed in the top row, while recessed-gate E-mode transistors with ohmic recesses such as transistors 810, 910, 1010, and 1020 are constructed in the bottom row, side-by-side to the D-mode transistors, all on a common substrate. Gate and ohmic recesses are approximately 30 nm in depth, and may be formed together, concurrently or in parallel, using appropriate photolithography and progressive etching steps as described with respect to FIGS. 11 and 12. By defining a threshold voltage $V_T$ as gate-to-source voltage $V_{GS}$ with drain current $I_D$ of 1e-3 mA/mm, a threshold voltage $V_T$ of −4.2 V is obtained for the D-mode transistors, and a threshold voltage $V_T$ of 0.5 V is obtained for the E-mode transistors. Recall that threshold voltages are gate voltages past which transistors are turned from an on-state to an off-state, or vice versa.

Figure 14:
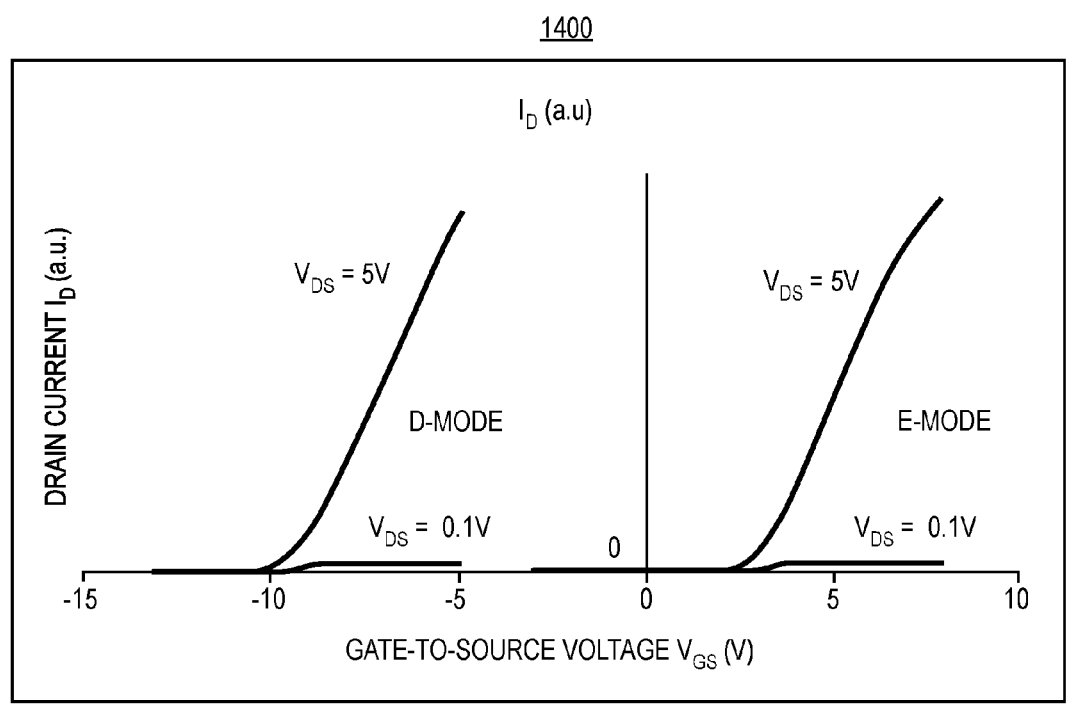
FIG. 14 shows a plot of $I_D$-$V_{GS}$ characteristics for integrated D-mode and E-mode transistors, according to one embodiment of the present invention.

Illustrative DC (direct current) characteristics of integrated E/D-mode transistors, with or without gate or ohmic recesses as illustrated by FIGS. 7-10 are shown in FIGS. 14 and 15. FIG. 14 displays a plot 1400 of approximate $I_D$-$V_{GS}$ characteristics for E/D transistors integrated on the same substrate. Drain current $I_D$ is expressed in arbitrary units, while drain-to-source voltages are fixed at 5V and 0.1V for each type of transistors. Threshold voltages for the two different types of transistors are within expected ranges of positive or negative values. Similarly, FIG. 15 shows plots 1500 and 1550 representing $I_D$-$V_{DS}$ characteristics for E/D transistors integrated on the same substrate. Drain current $I_D$ is expressed in arbitrary units, while $V_{GS}$ varies from −1V to −10V in −1V steps for D-mode transistors, and from 9V to 0V in −1V steps for E-mode transistors.

Additional Aspects

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present. The partially open-ended phrase "consisting essentially of" is meant to encompass essentially the material listed and does not preclude the presence of relatively small quantities of other materials, including the presence of dopants.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments. In other words, although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the spirit and scope of the present invention.

What is claimed is:

1. A method for integrating III-Nitride (III-N) transistors with different threshold voltages, comprising:
    patterning a III-N semiconductor structure to expose a gate region of a first transistor with a first threshold voltage VT1, wherein the III-N semiconductor structure comprises a common substrate, a buffer layer disposed on the common substrate, the buffer layer comprising a first III-N material, a channel layer disposed on the buffer layer, the channel layer comprising a second III-N material, a band-offset layer disposed on the channel layer, the band-offset layer comprising a third III-N material, and a cap layer comprising a plurality of selectively etchable sublayers, wherein each sublayer is selectively etchable with respect to a sublayer immediately below, and wherein each sublayer comprises a III-N material $Al_xIn_yGa_zN$ ($0 \leq X, Y, Z \leq 1$), wherein at least one of the plurality of selectively etchable sublayers has a non-zero Ga content ($0 < Z \leq 1$);
    selectively recessing the gate region of the first transistor by removing a first number of adjacent sublayers of the cap layer;
    patterning the III-N semiconductor structure to expose a gate region of a second transistor with a second threshold voltage $V_{T2}$;
    selectively recessing the gate region of the second transistor by removing a second number of adjacent sublayers of the cap layer, wherein the second number of adjacent sublayers is different from the first number of adjacent sublayers;
    forming gate electrodes for both the first and the second transistors; and
    forming ohmic contacts for both the first and the second transistors.

2. The method of claim 1, further comprising: disposing gate dielectrics over the gate region of the first transistor and the gate region of the second transistor.

3. The method of claim 1, wherein the first transistor is enhancement-mode, with the first threshold voltage $V_{T1} > 0$, and wherein the second transistor is depletion-mode, with the second threshold voltage $V_{T2} < 0$.

4. The method of claim 1, wherein adjacent sublayers of the cap layer have Al contents alternating between less than 50% ($0 \leq x < 0.5$) and greater than 50% ($0.5 < x \leq 1$).

5. The method of claim 1, further comprising: forming a first pair of ohmic recesses, wherein the first pair of ohmic contacts are disposed over and cover the first pair of ohmic recesses, and wherein bottoms of the first pair of ohmic recesses are on a layer selected from the group consisting the channel layer, the band-offset layer, and a sublayer of the cap layer.

6. A multi-layer semiconductor structure for integrating III-Nitride (III-N) transistors with different threshold voltages, comprising:
    a common substrate;
    a buffer layer disposed on the common substrate, the buffer layer comprising a first III-N material;
    a channel layer disposed on the buffer layer, the channel layer comprising a second III-N material;
    a band-offset layer disposed on the channel layer, the band-offset layer comprising a third III-N material;
    a cap layer comprising a plurality of selectively etchable sublayers, wherein each sublayer is selectively etchable with respect to a sublayer immediately below, wherein each sublayer comprises a III-N material $Al_xIn_yGa_zN$ ($0 \leq X, Y, Z \leq 1$), and wherein at least one of the plurality of selectively etchable sublayers has a non-zero Ga content ($0 < Z \leq 1$);
    a first transistor with a first threshold voltage VT1, comprising a first gate region and a first pair of ohmic contacts disposed outside the first gate region, wherein the first gate region comprises a first gate recess disposed in a first number of adjacent sublayers of the cap layer; and
    a second transistor with a second threshold voltage VT2, comprising a second gate region and a second pair of ohmic contacts disposed outside the second gate region, wherein the second gate region comprises a second gate recess disposed in a second number of adjacent sublayers of the cap layer, and wherein the second number of sublayers is different from the first number of sublayers.

7. The multi-layer semiconductor structure of claim 6, wherein the first gate region further comprises a first gate dielectric disposed over the first gate recess.

8. The multi-layer semiconductor structure of claim 6, wherein the first gate region further comprises a first gate dielectric disposed over the first gate recess, and wherein the second gate region further comprises a second gate dielectric disposed over the second gate recess.

9. The multi-layer semiconductor structure of claim 6, further comprising:
    a first pair of ohmic recesses, wherein the first pair of ohmic contacts are disposed over and cover the first pair of ohmic recesses, and wherein bottoms of the first pair of ohmic recesses are on a layer selected from the group consisting the channel layer, the band-offset layer, and a sublayer of the cap layer; and
    a second pair of ohmic recesses, wherein the second pair of ohmic contacts are disposed over and cover the second pair of ohmic recesses, and wherein bottoms of the second pair of ohmic recesses are on a layer selected from the group consisting the channel layer, the band-offset layer, and a sublayer of the cap layer.

10. The multi-layer semiconductor structure of claim 6, wherein the first transistor is enhancement-mode, with the first threshold voltage $V_{T1}>0$, and wherein the second transistor is depletion-mode, with the second threshold voltage $V_{T2}<0$.

11. The multi-layer semiconductor structure of claim 6, wherein at least one of the plurality of selectively etchable sublayers has an Al content greater than 50% ($0.5<x\leq1$).

12. The multi-layer semiconductor structure of claim 6, wherein adjacent sublayers of the cap layer have Al contents alternating between less than 50% ($0\leq x<0.5$) and greater than 50% ($0.5<x\leq1$).

13. The multi-layer semiconductor structure of claim 6, wherein materials for adjacent sublayers of the cap layer alternate between GaN and AlN.

14. The multi-layer semiconductor structure of claim 6, further comprising:
a first pair of ohmic recesses, wherein the first pair of ohmic contacts are disposed over and cover the first pair of ohmic recesses, and wherein the bottoms of the first pair of ohmic recesses are on a layer selected from the group consisting the channel layer, the band-offset layer, and a sublayer of the cap layer.

15. The multi-layer semiconductor structure of claim 6, wherein a subset of the plurality of the selectively etchable sublayers of the cap layer is doped.

16. The multi-layer semiconductor structure of claim 6, wherein the first, the second, and the third III-N materials are selected from the group consisting of GaN, AlN, AlGaN, InAlN, and AlInGaN.

17. The multi-layer semiconductor structure of claim 6, further comprising a spacer layer disposed on the band-offset layer, wherein the spacer layer comprises a fourth III-N material, and wherein a thickness of the spacer layer is less than or equal to 20 nm.

18. The multi-layer semiconductor structure of claim 17, wherein a subset of the plurality of selectively etchable sublayers of the cap layer is doped, and wherein the spacer layer is partially doped.

* * * * *